US012641986B2

(12) United States Patent
Ma et al.

(10) Patent No.: US 12,641,986 B2
(45) Date of Patent: May 26, 2026

(54) DISPLAY DEVICE AND HEAD MOUNTED DISPLAY DEVICE

(71) Applicant: SAMSUNG DISPLAY CO., LTD., Yongin-si (KR)

(72) Inventors: Ju Hwa Ma, Seoul (KR); Soo Min Baek, Hwaseong-si (KR); Bek Hyun Lim, Hwaseong-si (KR); Sang Ho Kim, Gwangmyeong si (KR); Jun Hyeong Park, Seoul (KR); Ju Youn Son, Cheonan-si (KR); Ji Won Lee, Suwon-si (KR); Cheon Myeong Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 492 days.

(21) Appl. No.: 18/177,678

(22) Filed: Mar. 2, 2023

(65) Prior Publication Data

US 2023/0320181 A1 Oct. 5, 2023

(30) Foreign Application Priority Data

Apr. 4, 2022 (KR) ......................... 10-2022-0041710

(51) Int. Cl.
| | |
|---|---|
| *H10K 59/80* | (2023.01) |
| *G06F 1/16* | (2006.01) |
| *H10K 59/122* | (2023.01) |
| *G02B 3/00* | (2006.01) |

(52) U.S. Cl.
CPC ........... *H10K 59/879* (2023.02); *G06F 1/163* (2013.01); *H10K 59/122* (2023.02); *H10K 59/8792* (2023.02); *G02B 3/0056* (2013.01)

(58) Field of Classification Search
CPC . H10K 59/8051–80518; H10K 59/878; H10K 59/879
See application file for complete search history.

(56) References Cited

U.S. PATENT DOCUMENTS

| | | | |
|---|---|---|---|
| 7,829,890 B2 * | 11/2010 | Cho | ..................... H10K 59/122 |
| | | | 257/59 |
| 7,915,805 B2 | 3/2011 | Koo et al. | |
| 10,665,820 B2 | 5/2020 | Yoo et al. | |
| 10,684,481 B2 | 6/2020 | Cho et al. | |

(Continued)

FOREIGN PATENT DOCUMENTS

| | | |
|---|---|---|
| CN | 112799158 | 5/2021 |
| JP | 2011-034931 | 2/2011 |

(Continued)

*Primary Examiner* — Evren Seven
(74) *Attorney, Agent, or Firm* — F. CHAU & ASSOCIATES, LLC

(57) ABSTRACT

A display device comprises a substrate, a sub-pixel disposed on the substrate and that includes a pixel electrode, a light emitting layer, and a common electrode, a pixel defining layer that defines the sub-pixel, a capping layer disposed on the pixel defining layer, a micro lens disposed on the capping layer and that overlaps the sub-pixel; and a total reflection pattern disposed on the capping layer and that overlaps the pixel defining layer and surrounds the micro lens. The micro lens has a refractive index greater than a refractive index of the total reflection pattern and less than or equal to a refractive index of the capping layer.

20 Claims, 21 Drawing Sheets

EML : LEL, 180
LEL : 171, 172, 173

(56)                    References Cited

U.S. PATENT DOCUMENTS

| | | | |
|---|---|---|---|
| 12,117,613 B2 | 10/2024 | Cho et al. | |
| 2005/0264183 A1* | 12/2005 | Seo .................. | H10K 59/80518 |
| | | | 313/504 |
| 2012/0235144 A1* | 9/2012 | Choung .......... | H10K 59/80516 |
| | | | 438/22 |
| 2017/0315372 A1* | 11/2017 | Bang ...................... | G02B 30/36 |
| 2020/0083484 A1* | 3/2020 | Lee ...................... | H10K 59/879 |
| 2020/0227489 A1* | 7/2020 | Kim ..................... | H10K 59/879 |
| 2020/0259123 A1 | 8/2020 | Yang et al. | |
| 2021/0005583 A1* | 1/2021 | Iguchi .................. | H10H 20/857 |
| 2022/0085319 A1* | 3/2022 | Kwon .................. | H10K 50/818 |
| 2022/0302229 A1* | 9/2022 | Yue ........................ | H10K 59/38 |
| 2023/0116030 A1* | 4/2023 | Sui ...................... | H10K 59/879 |
| | | | 257/40 |
| 2024/0355976 A1* | 10/2024 | Fan ...................... | H10H 20/855 |
| 2025/0035934 A1 | 1/2025 | Cho et al. | |
| 2025/0057016 A1* | 2/2025 | Uchida ............... | H10K 50/818 |

FOREIGN PATENT DOCUMENTS

| | | |
|---|---|---|
| KR | 10-2008-0041435 A | 5/2008 |
| KR | 10-2014-0014683 | 2/2014 |
| KR | 10-2018-0121750 A | 11/2018 |
| KR | 10-2018-0131714 A | 12/2018 |
| KR | 10-2020-0089379 | 7/2020 |

* cited by examiner

EML : LEL, 180
LEL : 171, 172, 173

LEL : 171, 172, 173

LEL : 171, 172, 173

LEL : 171, 172, 173

MLA1: LG1, LG2

1

DISPLAY DEVICE AND HEAD MOUNTED DISPLAY DEVICE

CROSS-REFERENCE TO RELATED APPLICATION

This application claims priority under 35 U.S.C. 119 from Korean Patent Application No. 10-2022-0041710, filed on Apr. 4, 2022 in the Korean Intellectual Property Office, the contents of which are herein incorporated by reference in their entirety.

TECHNICAL FIELD

Embodiments of the present disclosure are directed to a display device and a head mounted display device.

DISCUSSION OF THE RELATED ART

Display devices are becoming more widely used with the development of multimedia. In response to such developments, various types of display devices, such as a liquid crystal display (LCD) and an organic light emitting display (OLED), are being used.

Of the display devices, an organic light emitting display displays an image using an organic light emitting element that generates light by recombination of electrons and holes. An organic light emitting display has a fast response time, a high luminance and a large viewing angle, and has low power consumption.

A head mounted display device can be mounted on a user's head and has a form such as glasses or a helmet. A head mounted display device enables a user to recognize an image by displaying the image in front of the user's eyes.

SUMMARY

Embodiments of the present disclosure provide a display device that has a high light extraction efficiency.

Embodiments of the present disclosure also provide a display device and head mounted display device with a reduced a screen door effect.

According to an embodiment, a display device comprises a substrate, a sub-pixel disposed on the substrate and that includes a pixel electrode, a light emitting layer, and a common electrode, a pixel defining layer that defines the sub-pixel, a capping layer disposed on the pixel defining layer, a micro lens disposed on the capping layer and that overlaps the sub-pixel and; and a total reflection pattern disposed on the capping layer and that overlaps the pixel defining layer and surrounds the micro lens. The micro lens has a refractive index greater than a refractive index of the total reflection pattern and less than or equal to a refractive index of the capping layer.

A different between the refractive index of the micro lens and the refractive index of the total reflection pattern is greater than 0.05 and less than 0.3.

The pixel electrode includes a first pixel electrode and a second pixel electrode disposed on the first pixel electrode, wherein a side surface of the second pixel electrode has a first inclination angle with respect to a top surface of the first pixel electrode.

The pixel defining layer includes a first pixel defining layer that includes a first opening that exposes at least a portion of the first pixel electrode and a second pixel defining layer that includes a second opening that exposes at least a portion of the second pixel electrode, and the second pixel defining layer is disposed on the first pixel defining layer.

The second opening is smaller than the first opening.

The micro lens has a larger diameter than the second opening and a curvature that is greater than 0.12 and less than 0.2.

The side surface of the second pixel electrode is disposed on the first pixel defining layer.

The side surface of the second pixel electrode overlaps the total reflection pattern.

The side surface of the second pixel electrode does not overlap the total reflection pattern.

According to an embodiment, a display device comprises a substrate, a sub-pixel disposed on the substrate and that includes a pixel electrode, a light emitting layer, and a common electrode, a pixel defining layer that defines the sub-pixel, a capping layer disposed on the pixel defining layer, a micro lens disposed on the capping layer and that overlaps the sub-pixel; and a total reflection pattern disposed on the capping layer and that overlaps the pixel defining layer. The pixel electrode includes a first pixel electrode and a second pixel electrode disposed on the first pixel electrode. A side surface of the second pixel electrode has a first inclination angle with respect to a top surface of the first pixel electrode the total reflection pattern has a second inclination angle on a side surface in contact with the micro lens, and the second inclination angle is greater than the first inclination angle.

A difference between the refractive index of the micro lens and the refractive index of the total reflection pattern is greater than 0.05 and less than 0.3.

The pixel defining layer includes a first pixel defining layer that includes a first opening that exposes at least a portion of the first pixel electrode and a second pixel defining layer that includes a second opening that exposes at least a portion of the second pixel electrode, and the second pixel defining layer is disposed on the first pixel defining layer. The second opening is smaller than the first opening.

The display device further comprises a light blocking pattern disposed between the capping layer and the total reflection pattern and covered by the total reflection pattern.

According to an embodiment, a head mounted display device comprises a display unit, and a lens unit disposed on a path of light emitted from the display unit. The display unit includes a substrate, a sub-pixel disposed on the substrate and that includes a pixel electrode, a light emitting layer, and a common electrode, a pixel defining layer that defines the sub-pixel, a capping layer disposed on the pixel defining layer, a micro lens disposed on the capping layer and that overlaps the sub-pixel; and a total reflection pattern disposed on the capping layer and that overlaps the pixel defining layer and surrounds the micro lens. The micro lens has a refractive index greater than a refractive index of the total reflection pattern and less than or equal to a refractive index of the capping layer.

A difference between the refractive index of the micro lens and the refractive index of the total reflection pattern is greater than 0.05 and less than 0.3.

The pixel electrode includes a first pixel electrode and a second pixel electrode disposed on the first pixel electrode, where side surface of the second pixel electrode has a first inclination angle with respect to a top surface of the first pixel electrode.

The total reflection pattern has a second inclination angle on a side surface in contact with the micro lens, and the second inclination angle is greater than the first inclination angle.

The head mounted display device further comprises a light blocking pattern disposed between the capping layer and the total reflection pattern and covered by the total reflection pattern.

According to embodiments of the present disclosure, external emission efficiency of a display device is increased. In addition, a screen door effect of the display device is reduced.

DETAILED DESCRIPTION

Embodiments will now be described more fully hereinafter with reference to the accompanying drawings. The embodiments may, however, be provided in different forms and should not be construed as limiting. The same reference numbers may indicate the same components throughout the disclosure.

It will also be understood that when a layer is referred to as being "on" another layer or substrate, it can be directly on the other layer or substrate, or intervening layers may also be present.

When an element is referred to as being "connected" or "coupled" to another element, the element may be "directly connected" or "directly coupled" to another element, or "electrically connected" or "electrically coupled" to another element with one or more intervening elements interposed therebetween.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Figure 1:
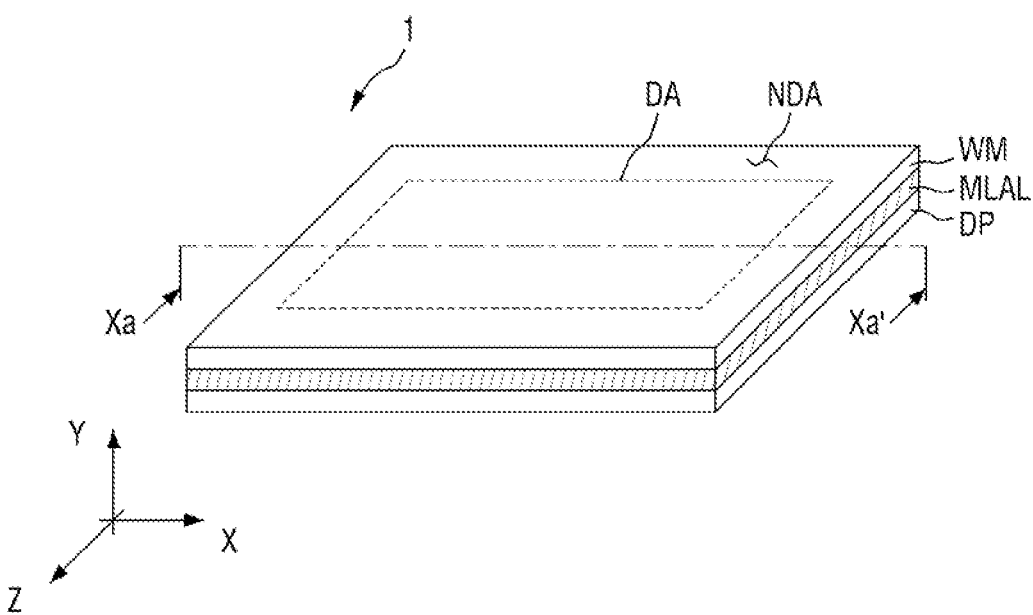
FIG. 1 is a perspective view of a display device according to an embodiment.
Figure 2:
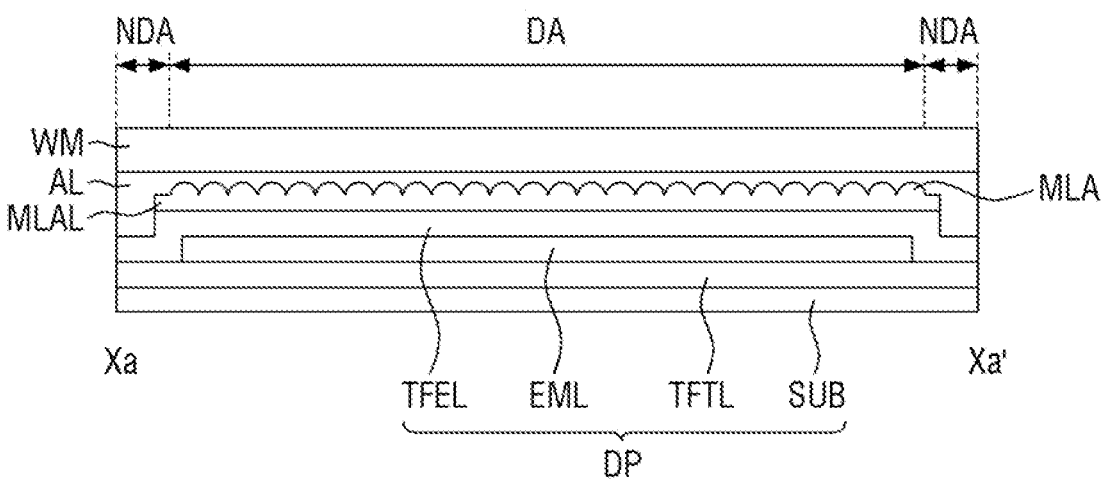
FIG. 2 is a cross-sectional view of a display device taken along line Xa-Xa' of FIG. 1.

FIG. 1 is a perspective view of a display device according to an embodiment, and FIG. 2 is a cross-sectional view of a display device taken along line Xa-Xa' of FIG. 1.

Referring to FIGS. 1 and 2, in an embodiment, a display device 1 includes a display panel DP, a window WM, and a micro lens array layer MLAL.

The display panel DP may be a rigid display panel or a flexible display panel. In the case of a flexible display panel, the display panel DP can be deformed by bending, folding, rolling, etc. In an embodiment of the present disclosure, the display panel DP includes an organic light emitting element.

The display panel DP includes a display area DA and a non-display area NDA. The display area DA is where an image is displayed, and the non-display area NDA is adjacent to the display area DA and is where no image is displayed. The non-display area NDA surrounds the display area DA. However, this is an example, and embodiments are not necessarily limited thereto. In some embodiments, the non-display area NDA is adjacent to only a portion of an edge of the display area DA.

The display panel DP includes a substrate SUB, a thin film transistor layer TFTL disposed on the substrate SUB, a light emitting element layer EML disposed on the thin film transistor layer TFTL, and a thin film encapsulation layer TFEL disposed on the light emitting element layer EML and the thin film transistor layer TFTL.

The substrate SUB is made of an insulating material such as glass, quartz, or a polymer resin. Examples of a polymer resin include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or combinations thereof. Alternatively, the substrate SUB includes a metal.

The substrate SUB may be a rigid substrate or a flexible substrate that can be bent, folded, or rolled. When the substrate SUB is a flexible substrate, the substrate SUB is formed of polyimide PI, but embodiments are not necessarily limited thereto.

The thin film transistor layer TFTL is disposed on the substrate SUB. The thin film transistor layer TFTL includes scan lines, data lines, power lines, scan control lines, and routing lines that connect pads and the data lines as well as thin film transistors of each of the pixels. Each of the thin film transistors includes a gate electrode, a semiconductor layer, a source electrode, and a drain electrode.

The thin film transistor layer TFTL is disposed in the display area DA and the non-display area NDA. For example, the thin film transistors of each of the pixels, the scan lines, the data lines, and the power lines of the thin film transistor layer TFTL are disposed in the display area DA.

The scan control lines and link lines of the thin film transistor layer TFTL are disposed in the non-display area NDA.

The light emitting element layer EML is disposed on the thin film transistor layer TFTL. The light emitting element layer EML includes pixels that include a first electrode, a light emitting layer, and a second electrode, and a pixel defining layer that defines the pixels. The light emitting layer is an organic light emitting layer that includes an organic material. For example, the light emitting layer includes a hole transport layer, an organic light emitting layer, and an electron transport layer. When a predetermined voltage is applied to the first electrode through the thin film transistor of the thin film transistor layer TFTL and a cathode voltage is applied to the second electrode, holes and electrons move to the organic light emitting layer through the hole transport layer and the electron transport layer, respectively, and combine with each other in the organic light emitting layer to emit light. The pixels of the light emitting element layer EML are disposed in the display area DA.

The thin film encapsulation layer TFEL is disposed on the light emitting element layer EML and the thin film transistor layer TFTL. The thin film encapsulation layer TFEL prevents oxygen or moisture from permeating into the light emitting element layer EML. The thin film encapsulation layer TFEL includes at least one inorganic layer. The inorganic layer is at least one of a silicon nitride layer, a silicon oxynitride layer, a silicon oxide layer, a titanium oxide layer, or an aluminum oxide layer, but embodiments are not necessarily limited thereto. In addition, the thin film encapsulation layer TFEL protects the light emitting element layer EML from foreign substances such as dust. The thin film encapsulation layer TFEL includes at least one organic layer. The organic layer is at least one of an acrylic resin, an epoxy resin, a phenolic resin, a polyamide resin, or a polyimide resin, but embodiments are not necessarily limited thereto.

The thin film encapsulation layer TFEL is disposed in both the display area DA and the non-display area NDA. For example, the thin film encapsulation layer TFEL covers the light emitting element layer EML in the display area DA, and covers the thin film transistor layer TFTL in the non-display area NDA.

The window WM is disposed on the display panel DP and is optically transparent. Accordingly, an image generated by the display panel DP can be seen through the window WM.

The micro lens array layer MLAL is disposed between the display panel DP and the window WM. The micro lens array layer MLAL is disposed between the pixels of the thin film transistor layer TFTL and the window WM. The micro lens array layer MLAL includes a plurality of micro lenses MLA that respectively correspond to the plurality of pixels.

Each of the plurality of micro lenses MLA has a predetermined radius of curvature, and enlarges an image output from the display panel DP and then projects the enlarged image onto a virtual surface.

The window WM is attached to the micro lens array layer MLAL by a transparent adhesive member AL, such as an optically clear adhesive (OCA) layer.

Figure 3:
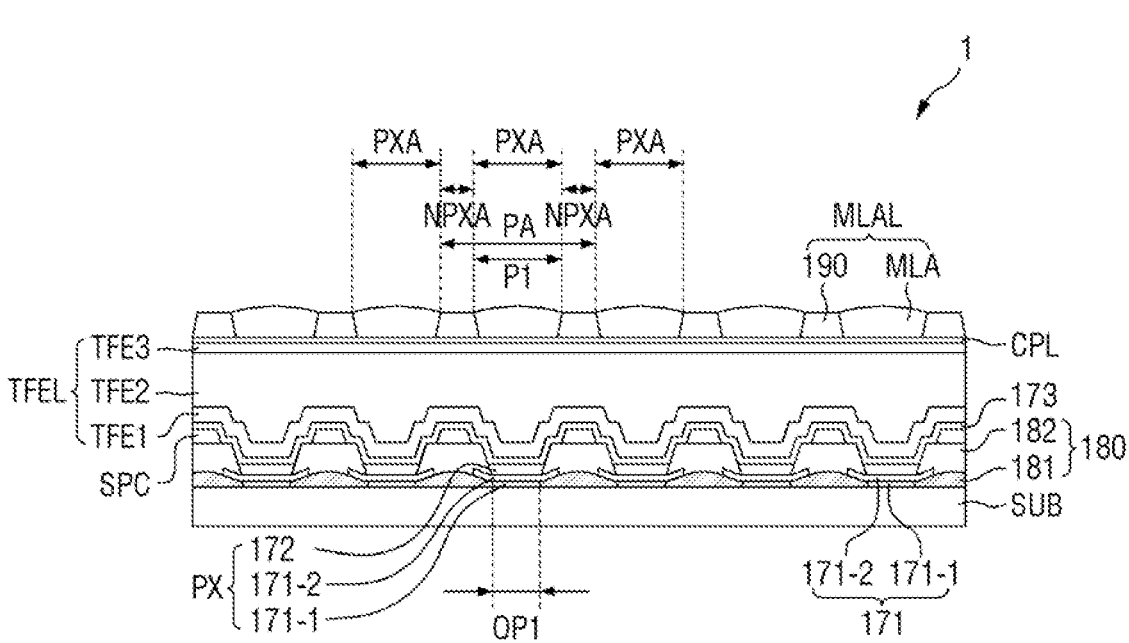
FIG. 3 is a cross-sectional view of a portion of a display device of FIG. 1.
Figure 4:
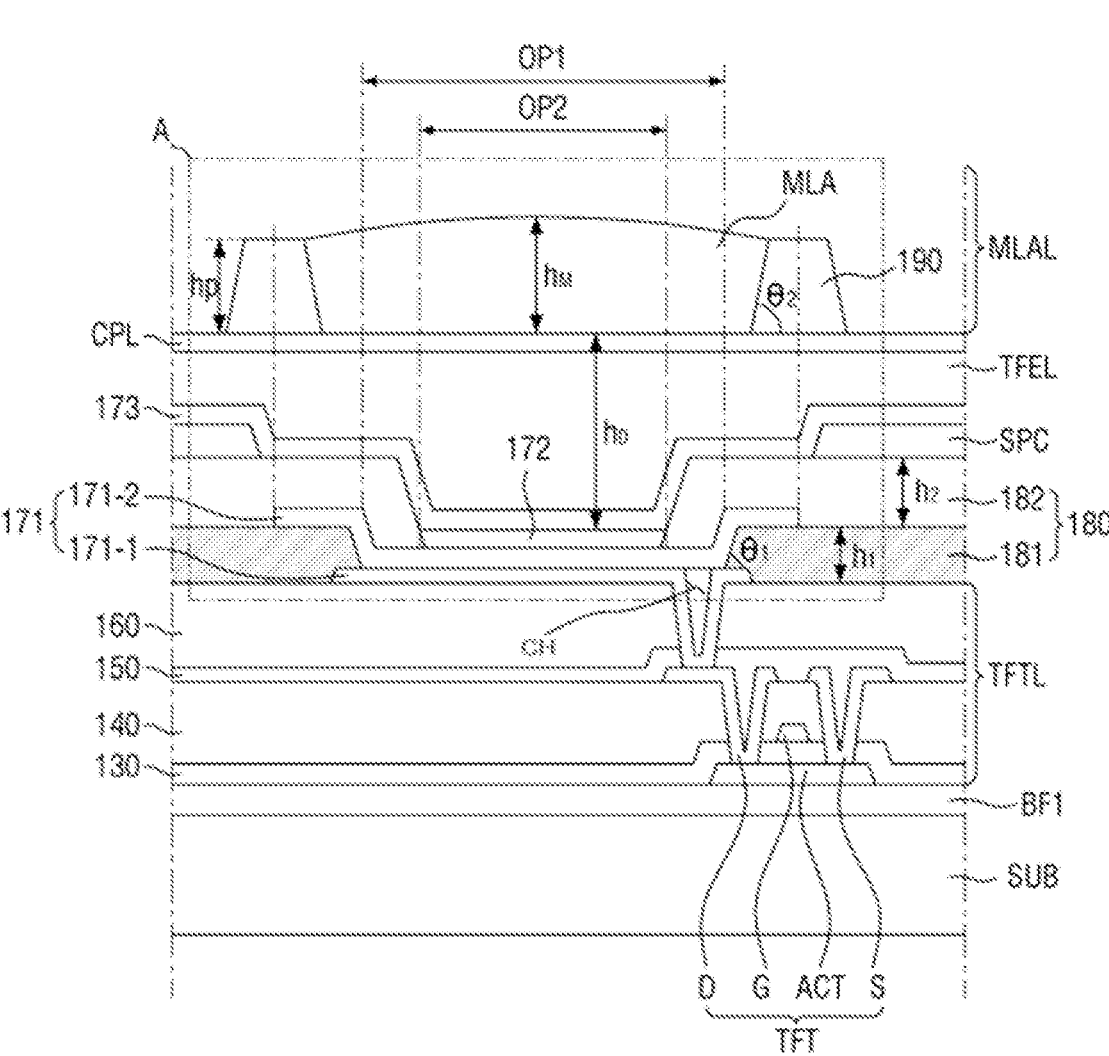
FIG. 4 is a cross sectional view of a pixel of a display panel according to an embodiment of the present disclosure.
Figure 5:
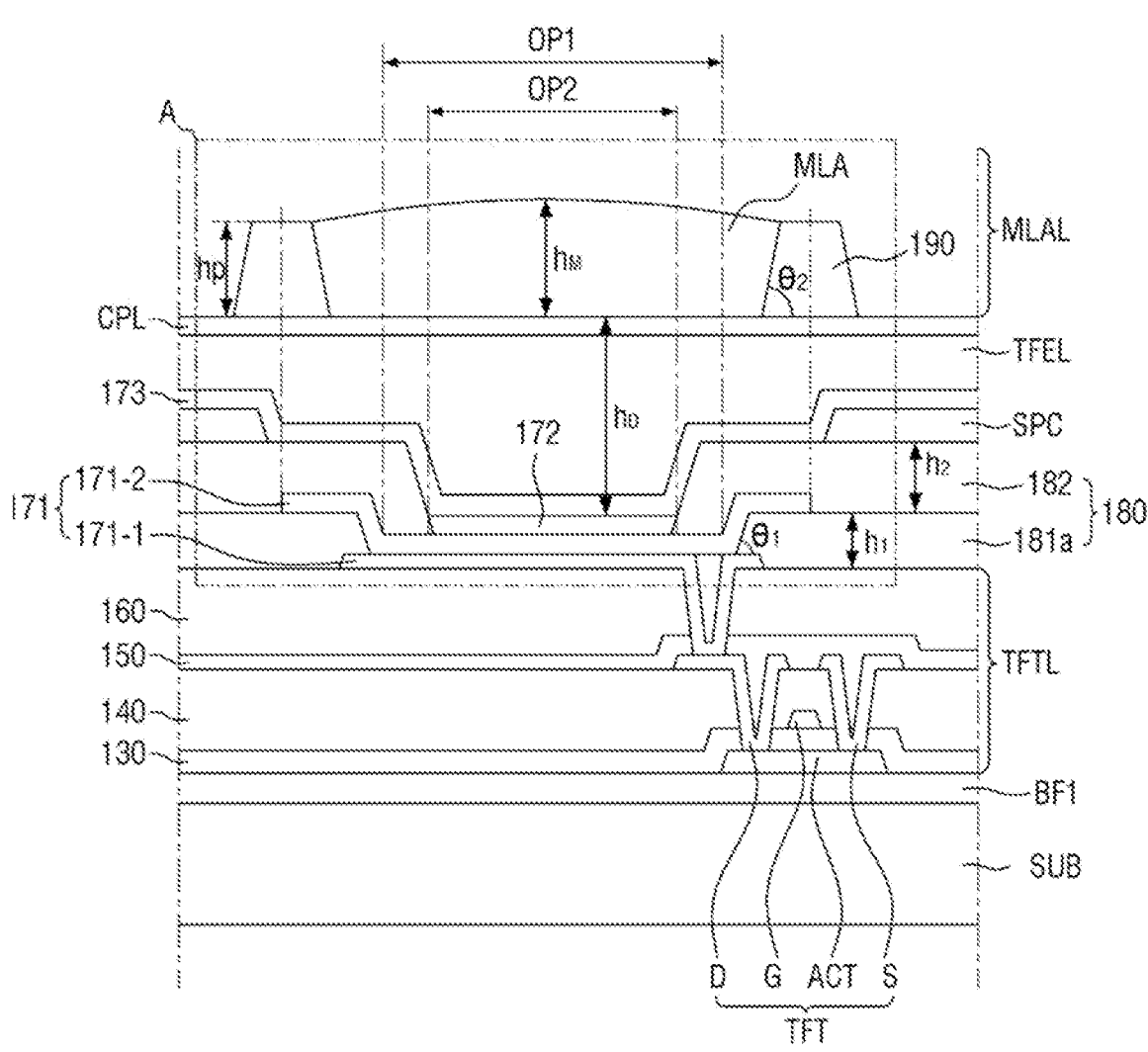
FIG. 5 is a cross sectional view one of a pixel of a display panel according to an embodiment of FIG. 4.

FIG. 3 is a detailed cross-sectional view of a display device of FIG. 1, FIG. 4 is a cross sectional view one of a pixel of a display panel according to an embodiment of the present disclosure, and FIG. 5 is a cross sectional view one of a pixel of a display panel according to an embodiment of FIG. 4.

Referring to FIGS. 3 and 4, in an embodiment, the thin film transistor layer TFTL is formed on the substrate SUB. The thin film transistor layer TFTL includes thin film transistors TFTs, a gate insulating layer 130, an interlayer insulating layer 140, a passivation layer 150, and a planarization layer 160.

A buffer layer BF1 is formed on one surface of the substrate SUB. The buffer layer BF1 is formed on one surface of the substrate SUB and protects the thin film transistors TFTs and a light emitting layer 172 of the light emitting element layer EML from moisture that permeates through the substrate SUB, which is vulnerable to moisture permeation. The buffer layer BF1 includes a plurality of inorganic layers that are alternately stacked. For example, the buffer layer BF1 is formed of multiple layers in which one or more inorganic layers of a silicon nitride layer, a silicon oxynitride layer, a silicon oxide layer, a titanium oxide layer, or an aluminum oxide layer are alternately stacked. In an embodiment, buffer layer BF1 is omitted.

The thin film transistor TFT is formed on the buffer layer BF1. The thin film transistor TFT includes an active layer ACT, a gate electrode G, a source electrode S, and a drain electrode D. FIG. 4 shows that the thin film transistor TFT is a top gate type in which the gate electrode G is positioned on an upper side of the active layer ACT, but embodiments of the present disclosure are not necessarily limited thereto. For example, in some embodiments, the thin film transistors TFT is a bottom gate type in which the gate electrode G is positioned on a lower side of the active layer ACT, or a double gate type in which the gate electrode G is positioned on both the upper and lower sides of the active layer ACT.

The active layer ACT is formed on the buffer layer BF1. The active layer ACT includes at least one of polycrystalline silicon, single crystal silicon, low-temperature polycrystalline silicon, amorphous silicon, or an oxide semiconductor. For example, the oxide semiconductor includes at least one of a binary compound (ABx), a ternary compound (ABxCy), or a quaternary compound (ABxCyDz) that contains at least one of indium, zinc, gallium, tin, titanium, aluminum, hafnium (Hf), zirconium (Zr), magnesium (Mg), etc. For example, the active layer ACT includes ITZO (an oxide that includes indium, tin, and titanium) or IGZO (an oxide that includes indium, gallium, and tin). A light blocking layer that blocks external light incident to the active layer ACT may be formed between the buffer layer and the active layer ACT.

The gate insulating layer 130 is formed on the buffer layer BF1 and the active layer ACT. The gate insulating layer 130 is formed of an inorganic layer, such as one of a silicon nitride layer, a silicon oxynitride layer, a silicon oxide layer, a titanium oxide layer, or an aluminum oxide layer.

A gate electrode G and a gate line are formed on the gate insulating layer 130. The gate electrode G and the gate line may be formed as a single layer or as multiple layers made of any one of molybdenum (Mo), aluminum (Al), chromium (Cr), gold (Au), titanium (Ti), nickel (Ni), neodymium (Nd), or copper (Cu), or alloys thereof.

The interlayer insulating layer 140 is formed on the gate insulating layer 130 and the gate electrode G and the gate line. The interlayer insulating layer 140 is formed of an inorganic layer, such as one of a silicon nitride layer, a silicon oxynitride layer, a silicon oxide layer, a titanium oxide layer, or an aluminum oxide layer.

A source electrode S and a drain electrode D are formed on the interlayer insulating layer 140. Each of the source electrode S and the drain electrode D is connected to the active layer ACT through a contact hole that penetrates through the gate insulating layer 130 and the interlayer insulating layer 140. The source electrode S and the drain electrode D may be formed as a single layer or as multiple layers made of any one of molybdenum (Mo), aluminum (Al), chromium (Cr), gold (Au), titanium (Ti), nickel (Ni), neodymium (Nd), or copper (Cu), or alloys thereof.

The passivation layer 150 insulates the thin film transistor TFT and is formed on the interlayer insulating layer 140 and the source electrode S and the drain electrode D. The passivation layer 150 is formed of an inorganic layer, such as one of a silicon nitride layer, a silicon oxynitride layer, a silicon oxide layer, a titanium oxide layer, or an aluminum oxide layer.

The planarization layer 160 planarizes steps caused by the thin film transistor TFT and is formed on the passivation layer 150. The planarization layer 160 is formed of an organic layer, such as one of an acrylic resin, an epoxy resin, a phenolic resin, a polyamide resin, or a polyimide resin.

The light emitting element layer EML is disposed on the planarization layer 160. The light emitting element layer EML includes light emitting elements LEL and a pixel defining layer 180. Each of the light emitting elements LEL includes a pixel electrode 171, the light emitting layer 172, and a common electrode 173. The common electrode 173 is commonly connected to the plurality of light emitting elements LEL.

The pixel electrode 171 is formed on the planarization layer 160. In an embodiment, the pixel electrode 171 is an anode electrode. When the pixel electrode 171 is an anode electrode, the pixel electrode 171 includes a reflective material. In an embodiment, reflective material includes one or more reflective films selected from silver (Ag), magnesium (Mg), chromium (Cr), gold (Au), platinum (Pt), nickel (Ni), copper (Cu), tungsten (W), or aluminum (Al), and a transparent or semitransparent electrode formed on the reflective film.

For example, the transparent or semitransparent electrode includes one or more of indium tin oxide (ITO), indium zinc oxide (IZO), zinc oxide (ZnO), indium oxide ($In_2O_3$), indium gallium oxide (IGO), or aluminum zinc oxide (AZO).

The pixel electrode 171 includes a first pixel electrode 171-1 and a second pixel electrode 171-2.

A contact hole CH is formed in the planarization layer 160. The contact hole CH exposes the drain electrode D of the thin film transistor TFT. The first pixel electrode 171-1 is connected to the drain electrode D of the thin film transistor TFT through the contact hole CH.

The second pixel electrode 171-2 is formed on the first pixel electrode 171-1 and a first pixel defining layer 181 to be described below. The second pixel electrode 171-2 is disposed on an inclined surface of the first pixel defining layer 181 and an upper side of the first pixel defining layer 181. The second pixel electrode 171-2 overlaps a total reflection pattern 190 to be described below.

A portion of the light emitted from the light emitting layer 172 does not propagate to an upper side of the second pixel electrode 171-2, but propagates to a side surface of the second pixel electrode 171-2 toward the first pixel defining layer 181.

The second pixel electrode 171-2 reflects the light that does not propagate to the upper side of the second pixel electrode 171-2 but propagates toward the side surface of the second pixel electrode 171-2. For example, since side light of the light emitting layer 172 is guided so that the side light propagates to the upper side without being lost, light extraction efficiency is increased, which increases emission efficiency.

The pixel defining layer 180 separates each of the light emitting elements LEL formed on the substrate SUB, and thus defines a light emitting area. In addition, the pixel defining layer 180 include a first pixel defining layer 181 and a second pixel defining layer 182.

The first pixel defining layer 181 is formed on the planarization layer 160. The first pixel defining layer 181 is not formed on an entire surface of the planarization layer 160 and includes an opening OP1 that exposes at least a portion of the first pixel electrode 171-1. For example, the first pixel defining layer 181 is formed in a spaced area between a plurality of adjacent first pixel electrodes 171-1 on the planarization layer 160.

The first pixel defining layer 181 covers an edge of the first pixel electrode 171-1.

The first pixel defining layer 181 includes an opaque material. The first pixel defining layer 181 includes an opaque material that can block light. For example, the first pixel defining layer 181 may include carbon black, but embodiments are not necessarily limited thereto. In some embodiments, the first pixel defining layer 181 includes a photopolymerizable compound that is cured by light irradiation, such as ultraviolet light, to turn black. The opaque material is distributed over an entire area of the first pixel defining layer 181, so that the first pixel defining layer 181 itself is opaque. However, embodiments of the present disclosure are not necessarily limited thereto, and in an embodiment, the opaque material is distributed only on the inclined surface of the first pixel defining layer 181, and only an area of the first pixel defining layer 181 in contact with the light emitted from the light emitting layer 172 is opaque. The first pixel defining layer 181 that includes the opaque material has a very low light transmittance. Accordingly, even if some light that is not reflected from the second pixel electrode 171-2 propagates to the first pixel defining layer 181, such light does not propagate through the first pixel defining layer 181 to be reflected again. For example, light emitted from the light emitting layer 172 to the first pixel defining layer 181 is prevented from dissipating as heat inside the first pixel defining layer 181 when propagating through the first pixel defining layer 181.

Referring to FIG. 5, in an embodiment, a first pixel defining layer 181a is formed of an organic layer, such as an acrylic resin, an epoxy resin, a phenolic resin, a polyamide resin, a polyimide resin, etc. The first pixel defining layer 181a is formed of the same material as the second pixel defining layer 182.

Referring back to FIGS. 3 and 4, in an embodiment, a side surface of the first pixel defining layer 181 has a first inclination angle $\theta_1$ where it meets a top surface of the pixel electrode. The first inclination angle $\theta_1$ ranges from 20° to 70°, and in an embodiment, ranges from 30° to 40°. An inclination angle of an inclined surface of the second pixel electrode 171-2 is determined by the first inclination angle $\theta_1$ of the first pixel defining layer 181. For example, the inclination angle of the inclined surface of the second pixel electrode 171-2 is equal to the first inclination angle $\theta_1$ of the first pixel defining layer 181.

The first pixel defining layer 181 has a first height h1. The first height h1 ranges from 1 to 2 μm, but embodiments are not necessarily limited thereto.

The second pixel defining layer 182 is disposed on the first pixel defining layer 181 and the second pixel electrode 171-2. The second pixel defining layer 182 is not formed on an entire surface of the second pixel electrode 171-2 and includes an opening OP2 that exposes at least a portion of the second pixel electrode 171-2.

The second pixel defining layer 182 overlaps the contact hole CH of the first pixel electrode 171-1. The opening OP2 formed in the second pixel defining layer 182 is smaller than the opening OP1 formed in the first pixel defining layer 181.

The second pixel defining layer 182 has a second height h2. The second height h2 ranges from 1 to 2 μm, but embodiments are not necessarily limited thereto.

The second pixel defining layer 182 maintains a gap between the edge of the second pixel electrode 171-2 and the common electrode 173 by the second height h2. The second pixel defining layer 182 increases the gap between the edge of the second pixel electrode 171-2 and the common electrode 173 to prevent an electric field from concentrating at the edge portion of the second pixel electrode 171-2. For example, the second pixel defining layer 182 prevents a short circuit between the second pixel electrode 171-2 and the common electrode 173.

The second pixel defining layer 182 is formed of an organic layer made of at least one of an acryl resin, an epoxy resin, a phenolic resin, a polyamide resin, a polyimide resin, etc.

The light emitting layer 172 is formed on the second pixel electrode 171-2. The light emitting layer 172 is disposed on the second pixel electrode 171-2. The light emitting layer 172 is disposed on an area of the second pixel electrode 171-2 exposed by the opening OP2 of the second pixel defining layer 182. For example, the light emitting layer 172 overlaps the opening OP2 of the second pixel defining layer 182. In an embodiment, the light emitting layer 172 covers at least a portion of the opening OP2 of the second pixel defining layer 182.

In an embodiment, the light emitting layer 172 emits one of red light, green light, or blue light. A wavelength of red light ranges from about 620 nm to 750 nm, a wavelength of green light ranges from about 495 nm to 570 nm, and a wavelength of blue light ranges from about 450 nm to 495 nm.

In an embodiment, the light emitting layer 172 emits white light. When the light emitting layer 172 emits white light, the light emitting layer 172 has, for example, a stacked structure of a red light emitting layer, a green light emitting layer, and a blue light emitting layer. In addition, the light emitting layer 172 may further include a separate color filter for displaying red, green, and blue light.

In addition, the light emitting layer 172 may have a multilayer structure that includes a hole transport layer, an organic light emitting layer, and an electron transport layer.

A spacer SPC is further disposed between the second pixel defining layer 182 and the common electrode 173. One surface of the spacer SPC is in contact with the second pixel defining layer 182, and the other surface of the spacer SPC is in contact with the common electrode 173. The spacer SPC maintains a gap between the second pixel defining layer 182 and the common electrode 173. The spacer SPC may be formed of an organic material or an inorganic material. For example, the spacer SPC is formed of an organic material, such as at least one of a photoresist, a polyacrylic resin, a polyimide resin, or an acrylic resin. In an embodiment, the spacer SPC is omitted.

The common electrode 173 is disposed on the light emitting layer 172, the second pixel defining layer 182 and the spacer SPC. In an embodiment, the common electrode 173 is formed entirely on the light emitting layer 172, the second pixel defining layer 182 and the spacer SPC. The common electrode 173 is commonly formed on all of the light emitting elements LEL. In an embodiment, the common electrode 173 is a cathode electrode. In an embodiment, the common electrode 173 includes one or more of Li, Ca, Lif/Ca, LiF/Al, Al, Ag, or Mg. In addition, the common electrode 173 may include a metal thin film that has a low work function. In an embodiment, the common electrode 173 is a transparent or semitransparent electrode that includes one or more of Indium tin oxide (ITO), indium zinc oxide (IZO), zinc oxide (ZnO), indium oxide (In₂O₃), indium gallium oxide (IGO), or aluminum zinc oxide (AZO).

In a top emission structure, the common electrode 173 is formed of transparent conductive oxide (TCO), such as indium tin oxide (ITO) or indium zinc oxide (IZO), that can transmit light, or a semi-transmissive conductive material such as magnesium (Mg), silver (Ag), or an alloy of magnesium (Mg) and silver (Ag). When the common electrode 173 is formed of a semi-transmissive conductive material, light emitting efficiency is increased by a micro cavity.

An encapsulation layer TFEL is disposed on the common electrode 173. The encapsulation layer TFEL includes at least one inorganic layer that prevents oxygen or moisture from permeating into the light emitting layer 172 and the common electrode 173. In addition, the encapsulation layer TFEL includes at least one organic layer that protects the light emitting element layer EML from foreign substances such as dust. For example, the encapsulation layer TFEL includes a first inorganic layer TFE1 disposed on the common electrode 173, an organic layer TFE2 disposed on the first inorganic layer TFE1, and a second inorganic layer TFE3 disposed on the organic layer TFE2. The first inorganic layer TFE1 and the second inorganic layer TFE3 are formed of at least one of a silicon nitride layer, a silicon oxynitride layer, a silicon oxide layer, a titanium oxide layer, or an aluminum oxide layer, but embodiments are not necessarily limited thereto. The organic layer is formed of at least one of an acrylic resin, an epoxy resin, a phenolic resin, a polyamide resin, or a polyimide resin, but embodiments are not necessarily limited thereto.

A second buffer layer is formed on the thin film encapsulation layer TFEL. The second buffer layer is formed of a plurality of inorganic layers that are alternately stacked. For example, the second buffer layer is formed of multiple layers in which one or more inorganic layers of a silicon nitride layer, a silicon oxynitride layer, a silicon oxide layer, a titanium oxide layer, or an aluminum oxide layer are alternately stacked. In an embodiment, the second buffer layer is omitted.

A capping layer CPL is formed on the encapsulation layer TFEL.

The capping layer CPL covers an entirety of the encapsulation layer TFEL. The capping layer CPL is formed of an organic material that has a high refractive index. A wavelength of light propagating through the capping layer CPL is amplified by surface plasma resonance. Accordingly, the intensity of a peak is increased, thereby increasing light extraction efficiency in a front light emitting display device. In some embodiments, the capping layer CPL is omitted.

A plurality of micro lenses MLA and total reflection patterns 190 are formed on the capping layer CPL.

The plurality of micro lenses MLA are spaced apart from each other. The total reflection pattern 190 is formed around and between the micro lenses MLA. The total reflection pattern 190 surrounds the micro lenses MLA in a plan view. In a cross section of the display device 1, the micro lens MLA and the total reflection pattern 190 are alternately disposed. Each of the plurality of micro lenses MLA overlaps the light emitting layer 172.

Each of the plurality of micro lenses MLA has a convex lens shape that convexly protrudes from a top surface of the capping layer CPL or a top surface of the thin film encapsulation layer TFEL. For example, each of the plurality of micro lenses MLA has a circular shape in a plan view. For example, each of the plurality of micro lenses MLA has a hemispherical protruding shape in a cross sectional view. However, the shape of the micro lenses MLA is not necessarily limited thereto. For example, in some embodiments, each of the plurality of micro lenses MLA has a polygonal or an elliptical shape in a plan view. In addition, in some embodiments, each of the plurality of micro lenses MLA may have a symmetrical or an asymmetrical structure. In addition, FIG. 3 shows each of the plurality of micro lenses MLA as having the same size. However, in an embodiment, each of the plurality of micro lenses MLA has a different size.

Each of the plurality of micro lenses MLA is formed of an acrylic resin, etc., and is formed on the thin film encapsulation layer TFEL through a photo process or an imprinting process.

By directly forming the plurality of micro lenses MLA on the display panel DP, the size of each of the plurality of micro lenses MLA is reduced to a size of the pixel. In addition, as the size of the micro lens MLA decreases, a distance between the micro lens MLA and the focal plane, such as the focal length, decreases. In an embodiment of the present disclosure, the focal length of the micro lens MLA ranges from about 10 μm to 30 μm. For example, a distance $h_D$ between the micro lens MLA and the light emitting layer 172 is from 5 μm to 10 μm.

Each pixel area PA of the display panel DP includes a light emitting area PXA and a non-light emitting area NPXA. The light emitting area PXA is where the light emitting layer 172 that actually emits light is disposed, and the non-light emitting area NPXA is a light blocking area adjacent to the light emitting area PXA and in which a light blocking material such as a black matrix is disposed. In an embodiment, the light emitting area PXA is wider than the opening OP1 of the first pixel defining layer 171-1.

The plurality of micro lenses MLA respectively correspond to the plurality of pixel areas PA. For example, each of the plurality of micro lenses MLA overlaps the light emitting area PXA of a corresponding pixel area PA. As illustrated in FIG. 3, each of the plurality of micro lenses MLA corresponds to the light emitting area PXA of a corresponding pixel area PA.

Each of the plurality of micro lenses MLA can focus on a corresponding pixel PX. In an embodiment, a size of the pitch P1 of each of the plurality of micro lenses MLA corresponds to the light emitting area PXA. The size of the pitch P1 of each of the plurality of micro lenses MLA corresponds to a diameter of the micro lenses MLA. The micro lens MLA has a diameter of about 10 μm or more.

In an embodiment, the pitch P1 of each of the plurality of micro lenses MLA is greater than the size of the opening OP1. The pitch P1 of each of the plurality of micro lenses MLA corresponds to a size of the light emitting area PXA.

In addition, by adjusting a radius of curvature and a height of each of the micro lenses MLA, the focus of each of the micro lenses MLA is focused on the corresponding pixel PX. Each of the plurality of micro lenses MLA has a curvature of 0.05 to 0.2, or a curvature of 0.12 to 0.2. The micro lens MLA has a thickness $h_M$ of 2 μm to 3.5 μm.

In addition, each of the plurality of micro lenses MLA corresponds to the light emitting area PXA of a corresponding pixel area PA. Therefore, when each of the micro lenses MLA extends to the non-light emitting area NPXA, when an image output from the pixel PX is enlarged, the image is enlarged to the non-light emitting area NPXA, which may result in a screen door effect in which the non-light emitting area NPAX is recognized by the user's eyes. However, since the micro lens MLA according to embodiments of the present disclosure corresponds to each light emitting area PXA, a phenomenon in which the non-light emitting area NPXA is enlarged and viewed is minimized.

The total reflection pattern 190 is formed on a top surface of the capping layer CPL or a top surface of the thin film encapsulation layer TFEL. The total reflection pattern 190 overlaps the non-light emitting area NPXA of the pixel area PA. The total reflection pattern 190 totally reflects light propagating in a lateral direction from the light emitting layer 172, rather than an upward direction (Z-axis direction) therefrom, to propagate in the upward direction (Z-axis direction). The total reflection pattern 190 overlaps the second pixel defining layer 182 and does not overlap the light emitting area PXA. The light emitting layer 172 is in the light emitting area PXA. For example, the total reflection pattern 190 does not overlap the light emitting layer 172.

The total reflection pattern 190 includes an inclined side surface in contact with the micro lens MLA that has a predetermined inclination angle with respect to the top surface of the capping layer CPL or the top surface of the thin film encapsulation layer TFEL. A taper angle $\theta_2$ of the inclined surface, that is, an inclination angle, is greater than 70 degrees and less than 90 degrees. The taper angle $\theta_2$ is an inclination angle of the inclined side surface of the total reflection pattern 190, and is an angle formed between the top surface of the capping layer CPL or the top surface of the thin film encapsulation layer TFEL and the inclined surface of the total reflection pattern 190.

The inclination angle of the total reflection pattern 190 is greater than the inclination angle of the inclined surface of the second pixel electrode 171-2.

The total reflection pattern 190 may be an organic layer or an organic layer that includes inorganic particles. The organic layer is made of at least one of an acrylic resin, an epoxy resin, a phenolic resin, a polyamide resin, or a polyimide resin, but embodiments are not necessarily limited thereto. The inorganic particles may be metal particles, but are not necessarily limited thereto.

The total reflection pattern 190 has a thickness hp, and as the thickness hp increases, a ratio of light emitted from the light emitting layer 172 that is totally reflected from the inclined surface of the total reflection pattern 190 and propagates in the upward direction (Z-axis direction) increases. Therefore, to increase a light emitting efficiency of the pixel PX, the total reflection pattern 190 has a thickness hp that is greater than about 1.5 μm and less than a thickness $h_M$ of the micro lens. A step between an upper portion of the total reflection pattern 190 in the z-direction and an upper portion of the micro lens MLA in the z-direction is 0.5 μm or more, and the thickness $h_M$ of the micro lens MLA is 5 μm or less, or 3.5 μm or less. Accordingly, the total reflection pattern 190 has a thickness hp of greater than 1.5 μm and less than 4.5 μm, or greater than 1.5 μm and less than 3 μM. The thickness hp of the total reflection pattern 190 refers to a distance from a bottom surface thereof to a top surface thereof as shown in FIGS. 4 and 5. The thickness $h_M$ of the micro lens MLA refers to a distance from a bottom surface thereof to a top surface thereof as shown in FIGS. 4 and 5.

The plurality of total reflection patterns 190 enlarge a light emitting area by redirecting light emitted from the plurality of light emitting element layers EML and propagating toward the side surface of the second pixel electrode 171-2 to an upper portion of the light emitting element layer EML. This will be described below with reference to FIG. 6.

Figure 6:
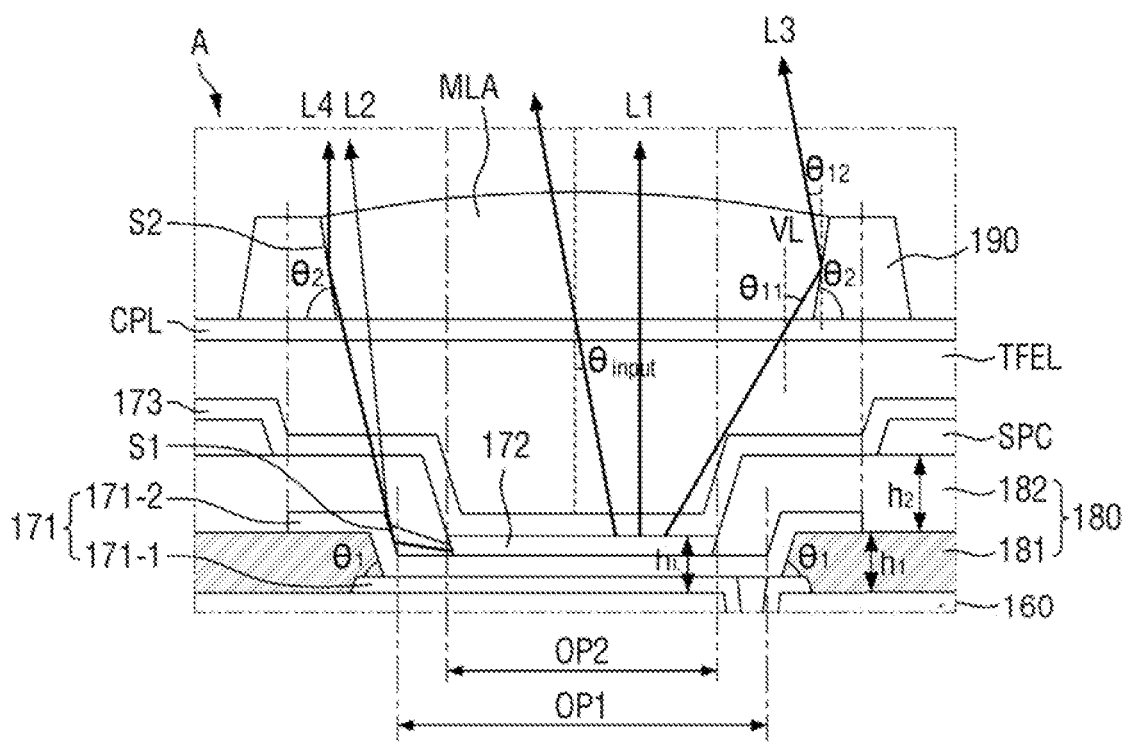
FIG. 6 is an enlarged view of area A of FIG. 4.

FIG. 6 is an enlarged view of area A of FIG. 4.

Referring to FIG. 6, in an embodiment, the light emitted from the light emitting layer 172 includes first light L1 that propagates toward the upper portion of the light emitting layer 172, and second light L2, third light L3, and fourth light that propagate toward the side surface of the light emitting layer 172. For convenience of description, light that is emitted from the light emitting layer 172 and does not propagate toward the upper portion thereof, but propagates toward the first pixel defining layer 181 or the second pixel defining layer 182 is referred to as side light.

The first light L1 propagates toward the upper portion of the light emitting layer 172, passes through the capping layer CPL and the micro lens MLA, and is emitted from the top surface of the micro lens MLA.

The second light L2 propagates toward the side surface of the light emitting layer 172, is reflected from an inclined surface S1 of the second pixel electrode 171-2, passes through the micro lens MLA, and is then emitted. To this end, a height $h_1$ of the first pixel defining layer 181 that forms the inclined surface S1 of the second pixel electrode 171-2 is higher than a height $h_L$ of the light emitting layer 172. For example, the height $h_1$ of the first pixel defining layer 181 is a height $h_L$ from one reference surface, such as one surface of the planarization layer 160 positioned on a lower side of the pixel defining layer 181 to the top surface of the first pixel defining layer 181, and the height $h_L$ of the light emitting layer 172 is a height $h_L$ from one surface of the planarization layer 160 to the top surface of the light emitting layer 172.

The third light L3 is emitted with a first emission angle $\theta_{11}$ at an interface between the capping layer CPL and the micro lens MLA and totally reflected with a second emission angle $\theta_{12}$ in the total reflection pattern 190. The side light of the light emitting layer 172 is refracted at the interface between the capping layer CPL and the micro lens MLA due to differences in refractive indices of the capping layer CPL and the micro lens MLA. Accordingly, the first light exit angle $\theta_{11}$ is an angle between the first light L1 and a line VL that is normal to the interface between the capping layer CPL and the micro lens MLA.

The fourth light L4 propagates toward the side surface of the light emitting layer 172 and is primarily reflected from the inclined surface S1 of the second pixel electrode 171-2. The primarily reflected light passes through the second pixel defining layer 182, the capping layer CPL, and the micro lens MLA, is secondarily reflected from an inclined surface S2 of the total reflection pattern 190, passes through the micro lens MLA, and is then emitted.

To totally reflect the light that is refracted at the interface between the capping layer CPL and the micro lens MLA and then propagates toward the total reflection pattern 190, a refractive index of the total reflection pattern 190 is less than that of the micro lens MLA. For example, a difference in refractive indices of the total reflection pattern 190 and the micro lens MLA is greater than 0.05 and less than 0.3. The refractive index of the micro lens MLA is greater than the refractive index of the total reflection pattern 190 and less than or equal to the refractive index of the capping layer CPL. In an embodiment, the curvature of the micro lens MLA is 0.12, the diameter of the micro lens MLA is 10 μm, the inclination angle of the total reflection pattern 190 is 70°, the inclination angle of the side surface of the second pixel electrode 171-2 is 30°, the refractive index of the micro lens MLA is 1.64, the refractive index of the total reflection pattern 190 is 1.53, and the difference in refractive indices of the total reflection pattern 190 and the micro lens MLA is 0.11.

Figure 7A:
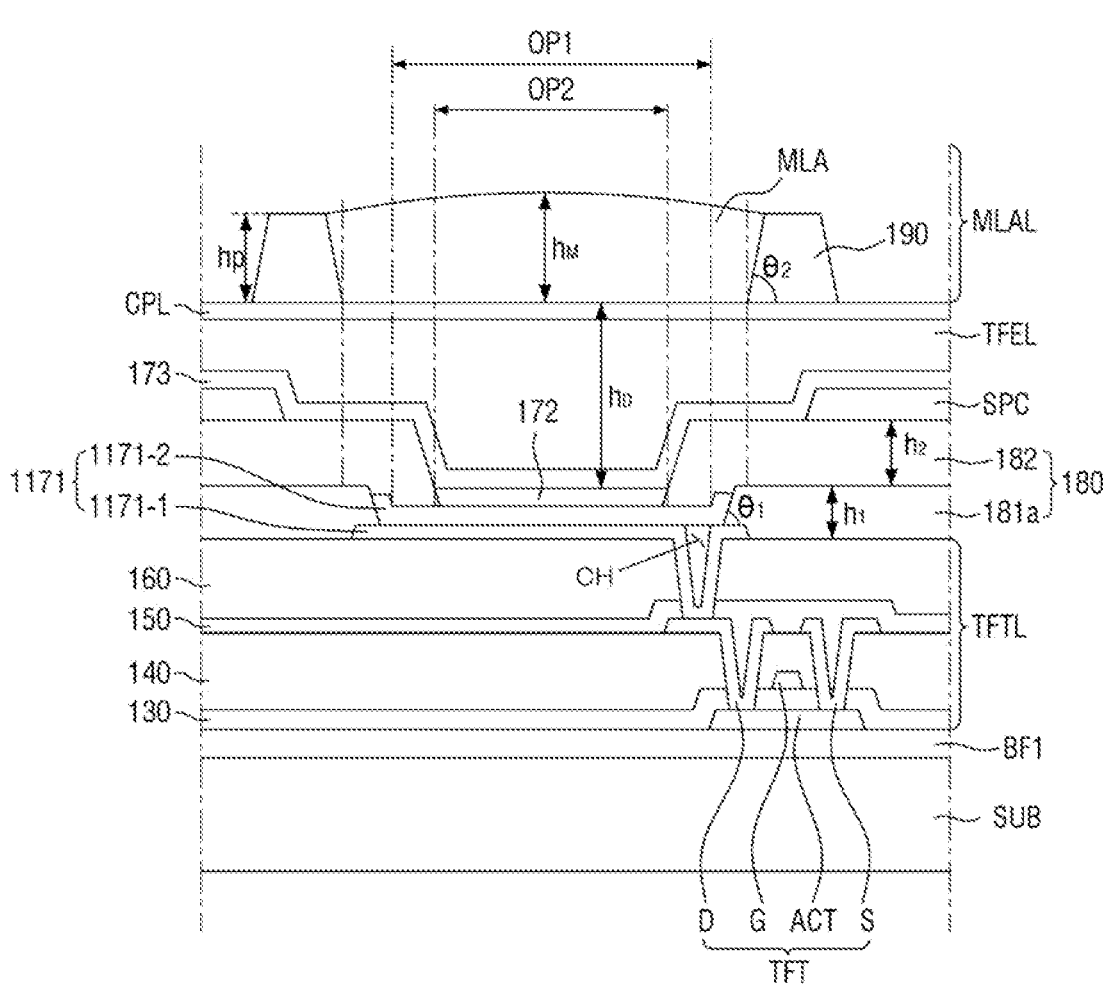
FIGS. 7A and 7B are cross sectional views one of a pixel of a display panel according to an embodiment of FIG. 5.
Figure 7B:
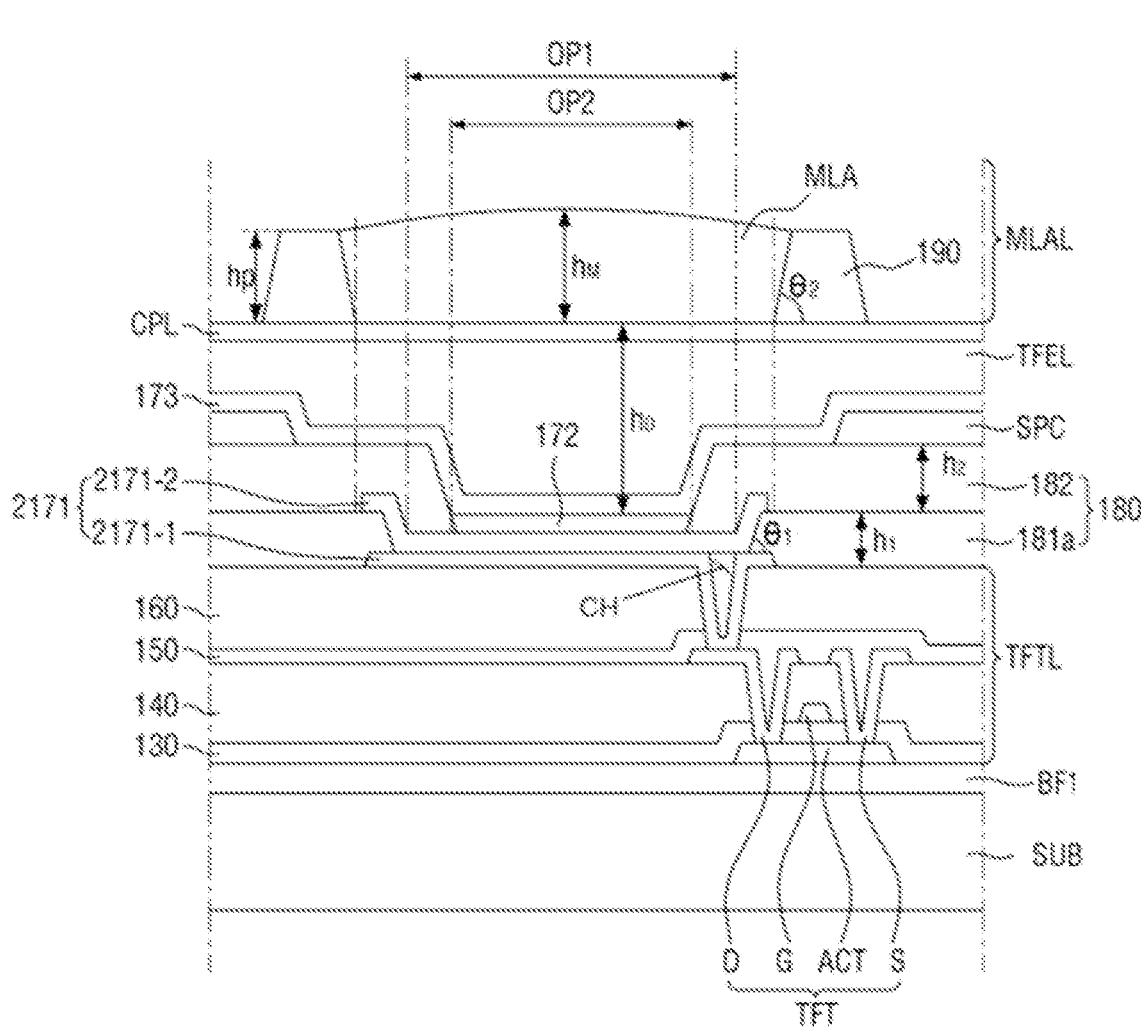

FIGS. 7A and 7B are cross sectional views one of a pixel of a display panel according to an embodiment of FIG. 5.

Referring to FIG. 7A, in an embodiment, a pixel electrode 1171 includes a first pixel electrode 1171-1 and a second pixel electrode 1171-2.

The first pixel electrode 1171-1 is formed on the planarization layer 160 and is connected to the drain electrode D of the thin film transistor TFT through the contact hole CH.

The second pixel electrode 1171-2 is formed on the first pixel electrode 1171-1 and the first pixel defining layer 181a. The second pixel electrode 1171-2 is disposed on an inclined side surface of the first pixel defining layer 181a. The second pixel electrode 1171-2 is not formed on a top surface of the first pixel defining layer 181a. The second pixel electrode 1171-2 does not overlap the total reflection pattern 190 to be described below.

Referring to FIG. 7B, in an embodiment, a pixel electrode 2171 includes a first pixel electrode 2171-1 and a second pixel electrode 2171-2. The second pixel electrode 2171-2 has a size that corresponds to that of the first pixel electrode 2171-1.

The first pixel electrode 2171-1 is formed on the planarization layer 160 and is connected to the drain electrode D of the thin film transistor TFT through the contact hole CH.

The second pixel electrode 2171-2 is formed on the first pixel electrode 2171-1 and the first pixel defining layer 181. The second pixel electrode 2171-2 is disposed on an inclined side surface of the first pixel defining layer 181a and a portion of an upper side of the first pixel defining layer 181a. The second pixel electrode 2171-2 does not overlap the total reflection pattern 190 to be described below.

As illustrated in FIGS. 7A and 7B, in some embodiments, when the second pixel electrodes 1171-2 and 2171-2 do not overlap the total reflection pattern 190, the first pixel defining layer 181a is formed of a transparent material. For example, the first pixel defining layer 181a is formed of an organic layer made of at least one of an acrylic resin, an epoxy resin, a phenolic resin, a polyamide resin, or a polyimide resin. The first pixel defining layer 181a is formed of the same material as the second pixel defining layer 182.

Descriptions of other components previously described with reference to FIGS. 4 and 5 and that have the same reference numerals are omitted.

Figure 8:
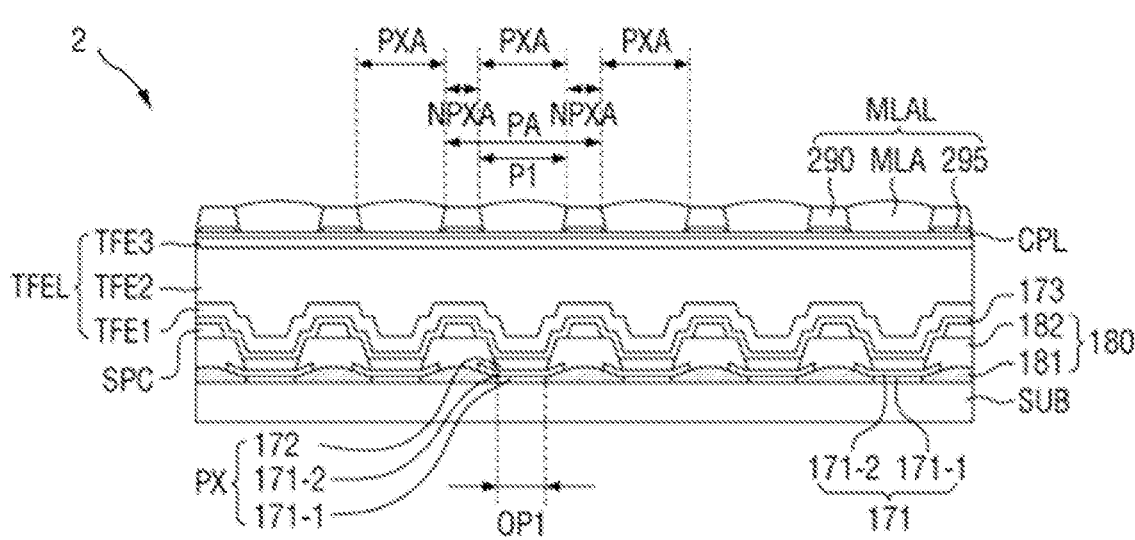
FIG. 8 is a cross-sectional view of a portion of a display device according to an embodiment of FIG. 3
Figure 9:
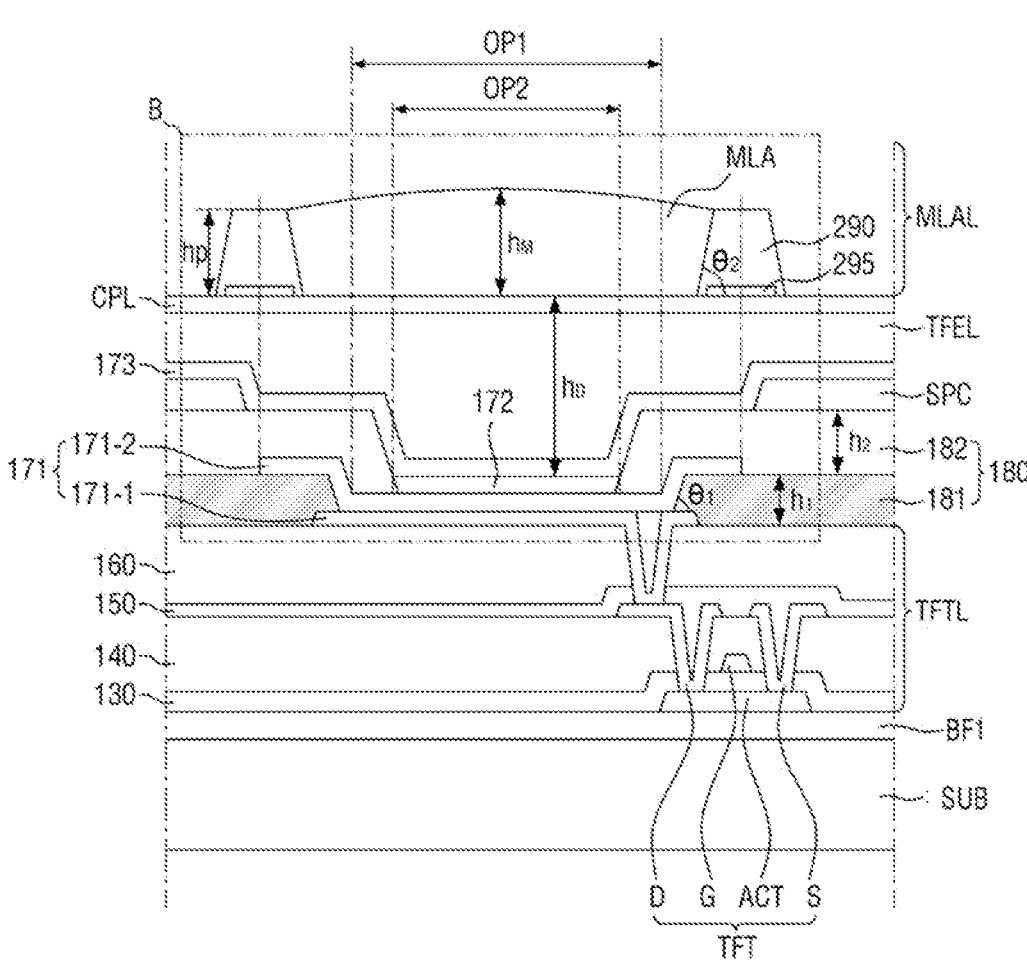
FIG. 9 is a cross sectional view one of a pixel of a display panel according to an embodiment of the present disclosure.
Figure 10:
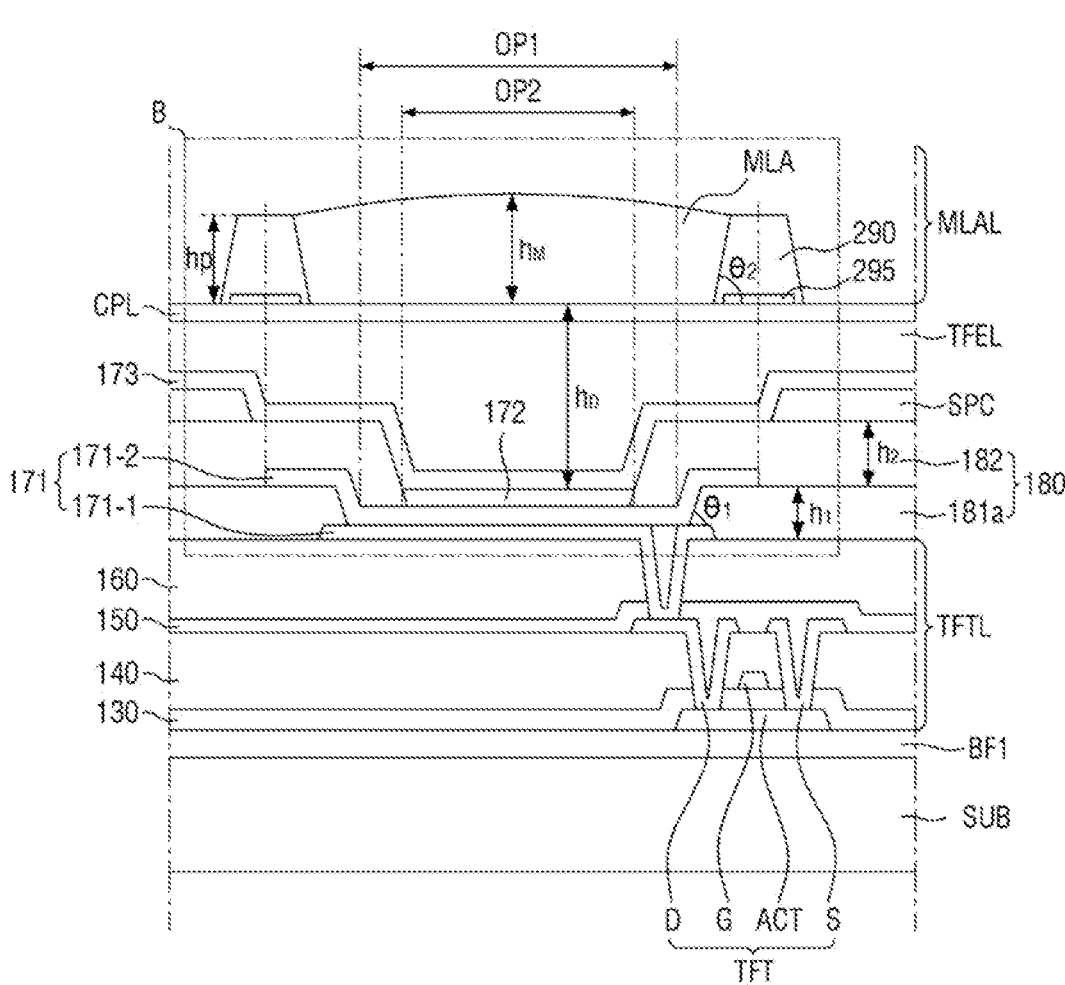
FIG. 10 is a cross sectional view one of a pixel of a display panel according to an embodiment of FIG. 9.

FIG. 8 is a detailed cross-sectional view of a portion of a display device according to an embodiment of FIG. 3, FIG. 9 is a cross sectional view of a pixel of a display panel according to an embodiment of the present disclosure, and FIG. 10 is a cross sectional view of a pixel of a display panel according to an embodiment of FIG. 9.

Referring to FIGS. 8 and 9, in an embodiment, a display device 2 includes a substrate SUB, a thin film transistor layer TFTL, a light emitting element layer EML, a thin film encapsulation layer TFEL, and a micro lens array layer MLAL.

The light emitting element layer EML includes light emitting elements LEL and a pixel defining layer 180. Each of the light emitting elements LEL includes a pixel electrode 171, a light emitting layer 172, and a common electrode 173. The common electrode 173 is commonly connected to all of the plurality of light emitting elements LEL.

Referring to FIGS. 9 and 10, in some embodiments, the pixel electrode 171 includes a first pixel electrode 171-1 and a second pixel electrode 171-2.

The pixel defining layer 180 includes a first pixel defining layer 181/181a and a second pixel defining layer 182.

In an embodiment, the first pixel defining layer 181 includes an opaque material that blocks light as described with reference to FIG. 4. In addition, the first pixel defining layer 181a in FIG. 10 is formed of an organic layer such as at least one of an acrylic resin, an epoxy resin, a phenolic resin, a polyamide resin, a polyimide resin, etc., as described with reference to FIG. 5. The first pixel defining layer 181a is formed of the same material as the second pixel defining layer 182.

Referring back to FIGS. 8 and 9, in an embodiment, the display device 2 further includes a capping layer CPL interposed between the thin film encapsulation layer TFEL and the micro lens array layer MLAL.

The micro lens array layer MLAL includes a plurality of micro lenses MLA, a total reflection pattern 290, and a light blocking pattern 295.

The plurality of micro lenses MLA and the total reflection pattern 290 are formed on the capping layer CPL. The light blocking pattern 295 is formed between the capping layer CPL and the total reflection pattern 290.

The light blocking pattern 295 is formed of a photosensitive resin that blocks light. For example, the light blocking pattern 295 includes an inorganic black pigment or an organic black pigment such as carbon black. The light blocking pattern 295 has a lower light transmittance than the total reflection pattern 290. The light transmittance of the light blocking pattern 295 is 60% or less. Accordingly, even if some light not reflected from the second pixel electrode 171-2 propagates to the light blocking pattern 295, such light does not pass through the light blocking pattern 295 to be reflected again. Accordingly, the light blocking pattern 295 prevents color mixing between adjacent light emitting areas.

The plurality of micro lenses MLA are spaced apart from each other. The total reflection pattern 290 is formed adjacent to and between the micro lens MLA. The total reflection pattern 290 surrounds the micro lens MLA in a plan view. In a cross section of the display device 2, the micro lens MLA and the total reflection pattern 290 are alternately disposed. Each of the plurality of micro lenses MLA overlaps a corresponding light emitting layer 172.

Each of the plurality of micro lenses MLA has a convex lens shape that convexly protrudes from a top surface of the capping layer CPL or a top surface of the thin film encapsulation layer TFEL. For example, each of the plurality of micro lenses MLA has a circular shape in a plan view. For example, each of the plurality of micro lenses MLA has a hemispherical protruding shape in a cross sectional view. However, the shape of the micro lens MLA is not necessarily limited thereto. For example, in some embodiments, each of the plurality of micro lenses MLA has a polygonal or an elliptical shape in a plan view. In addition, in some embodiments, each of the plurality of micro lenses MLA has a symmetrical or asymmetrical structure. In addition, FIG. 8 shows that each of the plurality of micro lenses MLA has the same size. However, in some embodiments, each of the plurality of micro lenses MLA has a different size.

Each of the plurality of micro lenses MLA is formed of an acrylic resin, etc., and is formed on the thin film encapsulation layer TFEL or the capping layer CPL through a photo process or an imprinting process.

Each pixel area PA of the display panel DP includes a light emitting area PXA and a non-light emitting area NPXA. The light emitting area PXA is where the light emitting layer 172 that actually emits light is disposed, and the non-light emitting area NPXA is adjacent to the light emitting area PXA and is where a light blocking pattern 295 is disposed. In an embodiment, the light emitting area PXA is wider than the opening OP1 formed in the first pixel defining layer 171-1.

The plurality of micro lenses MLA respectively correspond to the plurality of pixel areas PA. For example, each of the plurality of micro lenses MLA overlap the light emitting area PXA of a corresponding pixel area PA. As illustrated in FIG. 8, each of the plurality of micro lenses MLA corresponds to the light emitting area PXA of a corresponding pixel area PA.

Each of the plurality of micro lenses MLA can focus on the corresponding pixel PX. A size of a pitch P1 of each of the plurality of micro lenses MLA corresponds to the light emitting area PXA. In an embodiment, the pitch P1 of each of the plurality of micro lenses MLA is greater than the size of the opening OP1. The pitch P1 of each of the plurality of micro lenses MLA corresponds to a size of the light emitting area PXA.

In addition, by adjusting a radius of curvature and a height of each of the micro lenses MLA, each of the micro lenses MLA is focused on the corresponding pixel PX. Each of the plurality of micro lenses MLA has a curvature of 0.05 to 0.2, or a curvature of 0.12 to 0.2. The micro lens MLA has a thickness $h_M$ of 2 μm to 3.5 μm.

In addition, each of the plurality of micro lenses MLA corresponds to the light emitting area PXA of a corresponding pixel area PA. Therefore, when each of the micro lenses MLA extends to the non-light emitting area NPXA, when an image output from the pixel PX is enlarged, the image is enlarged to the non-light emitting area NPXA, which may result in a screen door effect in which the non-light emitting area NPAX is recognized by the user's eyes. However, since the micro lens MLA according to an embodiment of the present disclosure correspond to each light emitting area PXA, a phenomenon in which the non-light emitting area NPXA is enlarged and viewed is minimized.

The total reflection pattern 290 is formed on a top surface of the capping layer CPL or a top surface of the thin film encapsulation layer TFEL. The total reflection pattern 290 overlaps the non-light emitting area NPXA of the pixel area PA. The total reflection pattern 290 totally reflects light emitted from the light emitting layer 172 and propagating in a lateral direction rather than an upward direction (Z-axis direction) to propagate in the upward direction (Z-axis direction). The total reflection pattern 290 overlaps the second pixel defining layer 182 but does not overlap the light emitting area PXA. The light emitting layer 172 is in the light emitting area PXA. For example, the total reflection pattern 290 does not overlap the light emitting layer 172.

The total reflection pattern 290 includes an inclined side surface in contact with the micro lens MLA that has a predetermined inclination angle with respect to the top surface of the capping layer CPL or the top surface of the thin film encapsulation layer TFEL. A taper angle $\theta_2$ of the inclined surface is greater than 70 degrees and less than 90 degrees. The taper angle $\theta_2$ is an inclination angle of the inclined side surface of the total reflection pattern 290, and is an angle formed between the top surface of the capping layer CPL or the top surface of the thin film encapsulation layer TFEL and the inclined surface of the total reflection pattern 290.

The total reflection pattern 290 is formed of an organic layer or an organic layer that includes inorganic particles. The organic layer is made of at least one of an acrylic resin, an epoxy resin, a phenolic resin, a polyamide resin, or a polyimide resin, but embodiments are not necessarily limited thereto. The inorganic particles may be metal particles, but are not necessarily limited thereto.

The total reflection pattern 190 has a thickness hp, and as the thickness hp increases, a ratio of light emitted from the light emitting layer 172 that is totally reflected from the inclined surface of the total reflection pattern 290 and propagates in the upward direction (Z-axis direction) increases. Therefore, to increase a light emitting efficiency of the pixel PX, the total reflection pattern 290 has a thickness hp that is greater than 1.5 μm and less than a thickness $h_M$ of the micro lens. A step between the total reflection pattern 190 and the micro lens MLA in the z-direction is greater than 0.5 μm, and the thickness $h_M$ of the micro lens MLA is less than 5 μm, or less than 3.5 μm. Accordingly, the total reflection pattern 290 has a thickness hp that is greater than 1.5 μm and less than 4.5 μm, or greater than 1.5 μm and less than 3 μm. The thickness hp of the total reflection pattern 290 is a distance from a bottom surface thereof to a top surface thereof as shown in FIGS. 9 and 10. The thickness $h_M$ of the micro lens MLA refers to a distance from a bottom surface thereof to a top surface thereof as shown in FIGS. 9 and 10.

The plurality of total reflection patterns 290 enlarges a light emitting area by redirecting light emitted from the plurality of light emitting element layers EML and that is propagating toward the side surface of the second pixel electrode 171-2 to an upper portion of the light emitting element layer EML. This will be described below with reference to FIG. 11.

Descriptions of components previously described with reference to FIGS. 3, 4, and 5 and that have the same reference numerals are omitted.

Figure 11:
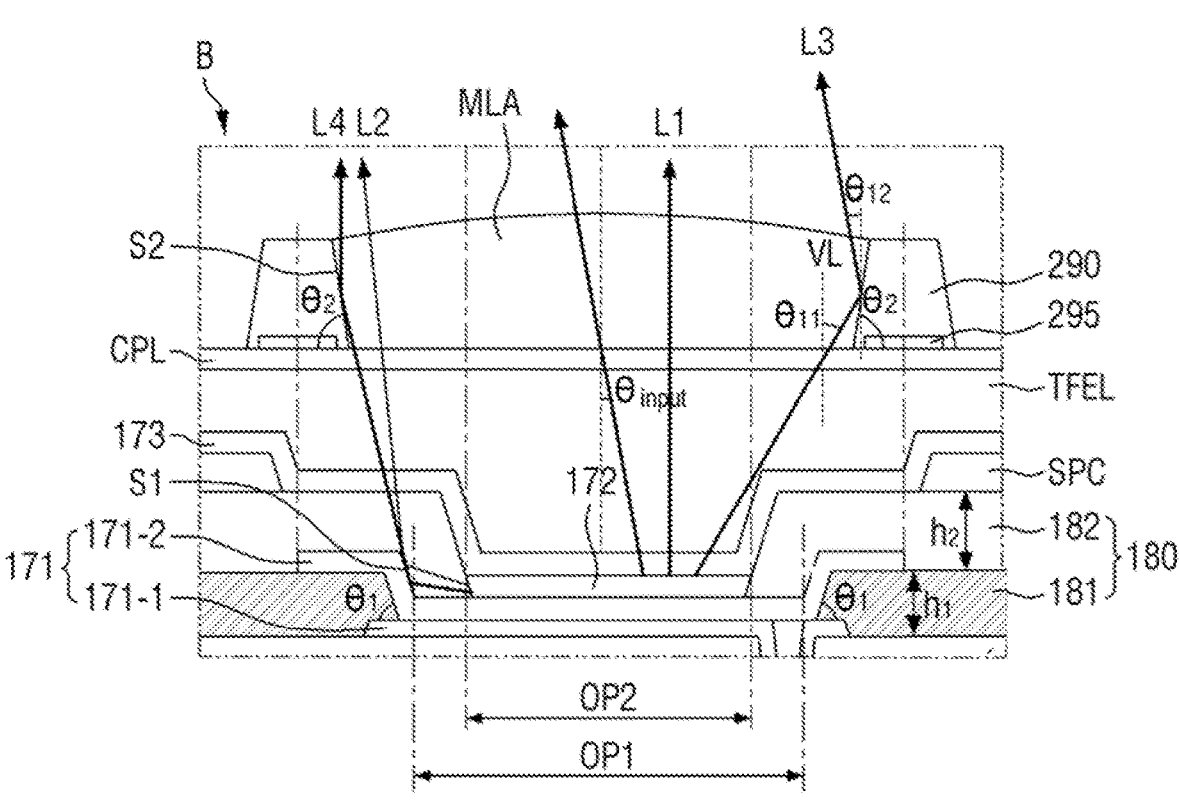
FIG. 11 is an enlarged view of area B of FIG. 9.

FIG. 11 is an enlarged view of area B of FIG. 9.

Referring to FIG. 11, in an embodiment, the light emitting area (PXA in FIG. 8) expands beyond the opening OP1 by totally reflecting the side light of the light emitting layer 172 through the second pixel electrode and the total reflection pattern 290 as described with reference to FIG. 6. On the other hand, in a conventional case, the light emitting area has the same size as the opening.

Figure 12:
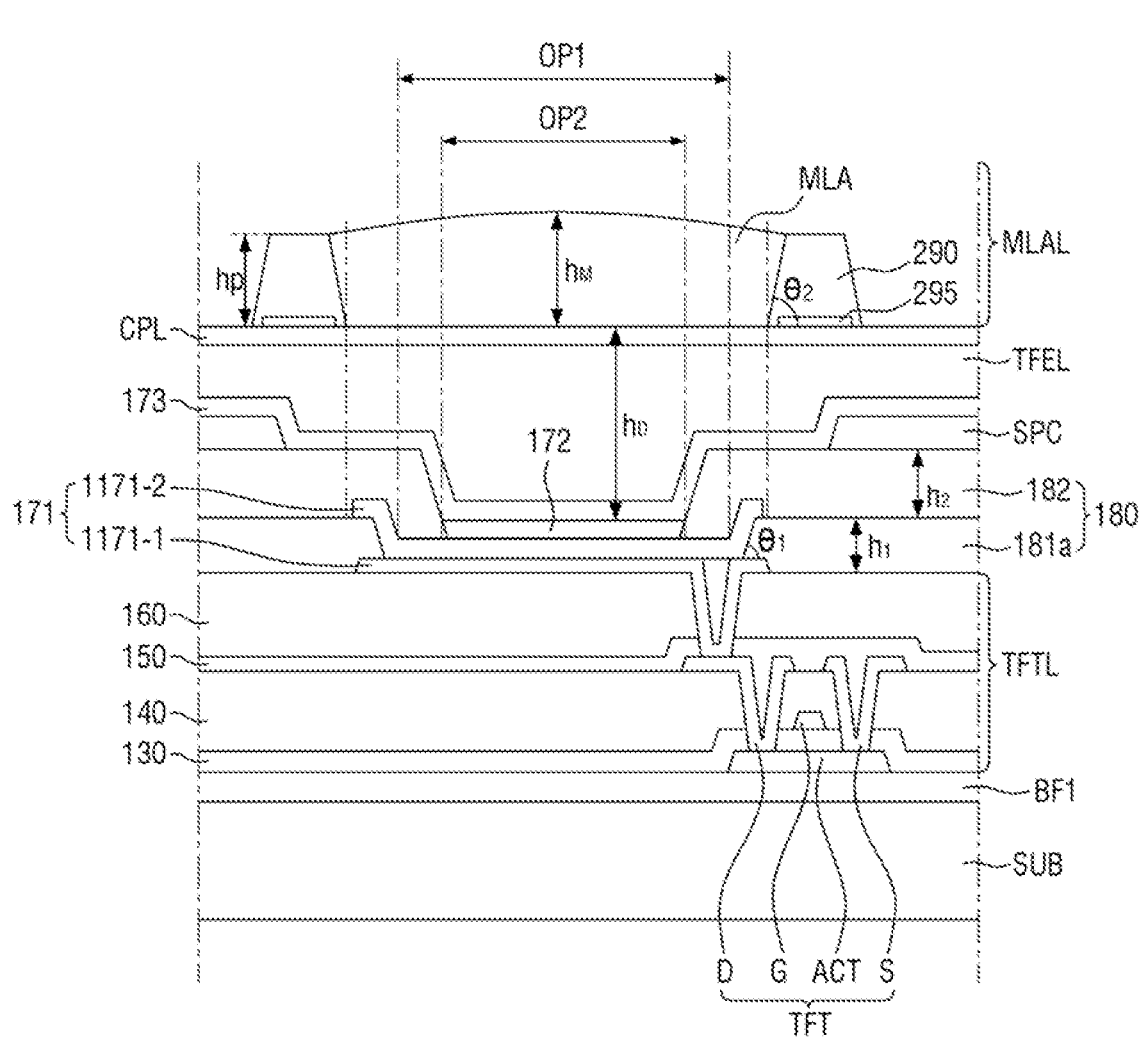
FIG. 12 is a cross sectional view one of a pixel of a display panel according to an embodiment of FIG. 10.

FIG. 12 is a cross sectional view one of a pixel of a display panel according to an embodiment of FIG. 10.

Referring to FIG. 12, in an embodiment, the second pixel electrode 1171-2 has a size that corresponds to that of the first pixel electrode 1171-1. The second pixel electrode 1171-2 does not overlap the total reflection pattern 290. When the second pixel electrode 1171-2 does not overlap the total reflection pattern 290, the first pixel defining layer 181*a* is formed of a transparent material. Therefore, the first pixel defining layer 181*a* is formed of an organic layer, such as at least one of an acryl resin, an epoxy resin, a phenolic resin, a polyamide resin, a polyimide resin, etc. The first pixel defining layer 181*a* is formed of the same material as the second pixel defining layer 182.

Figure 13:
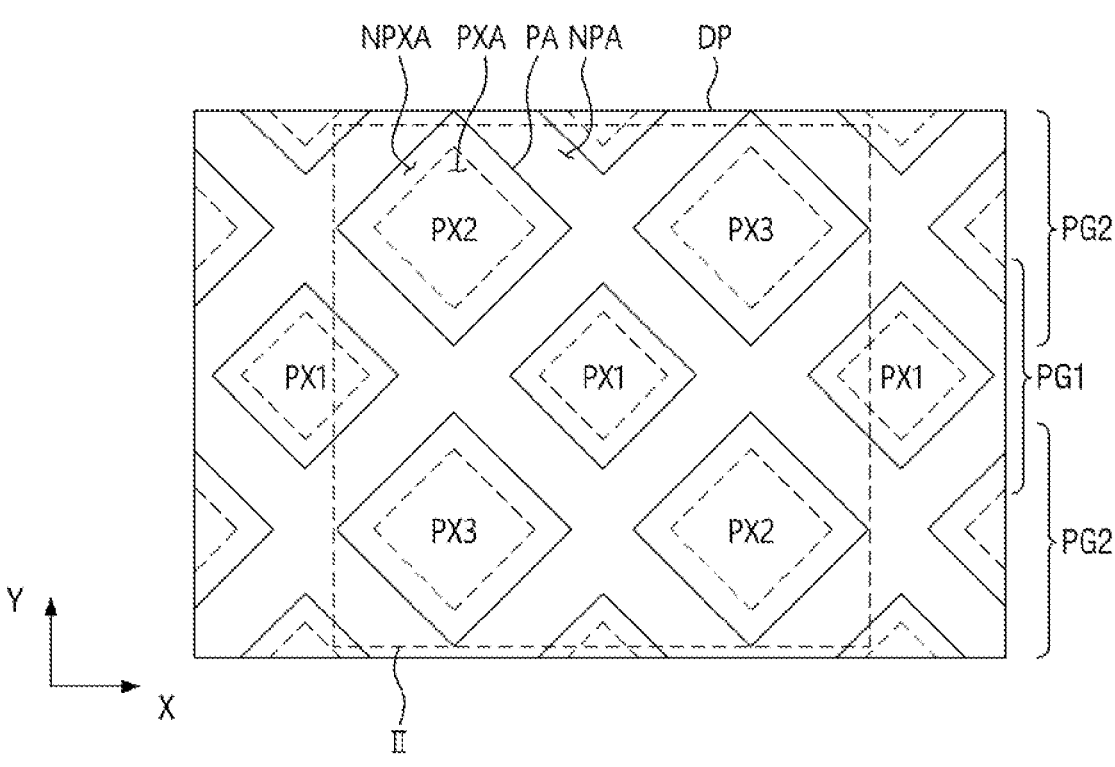
FIG. 13 is a plan view of a display device according to an embodiment of the present disclosure.
Figure 14:
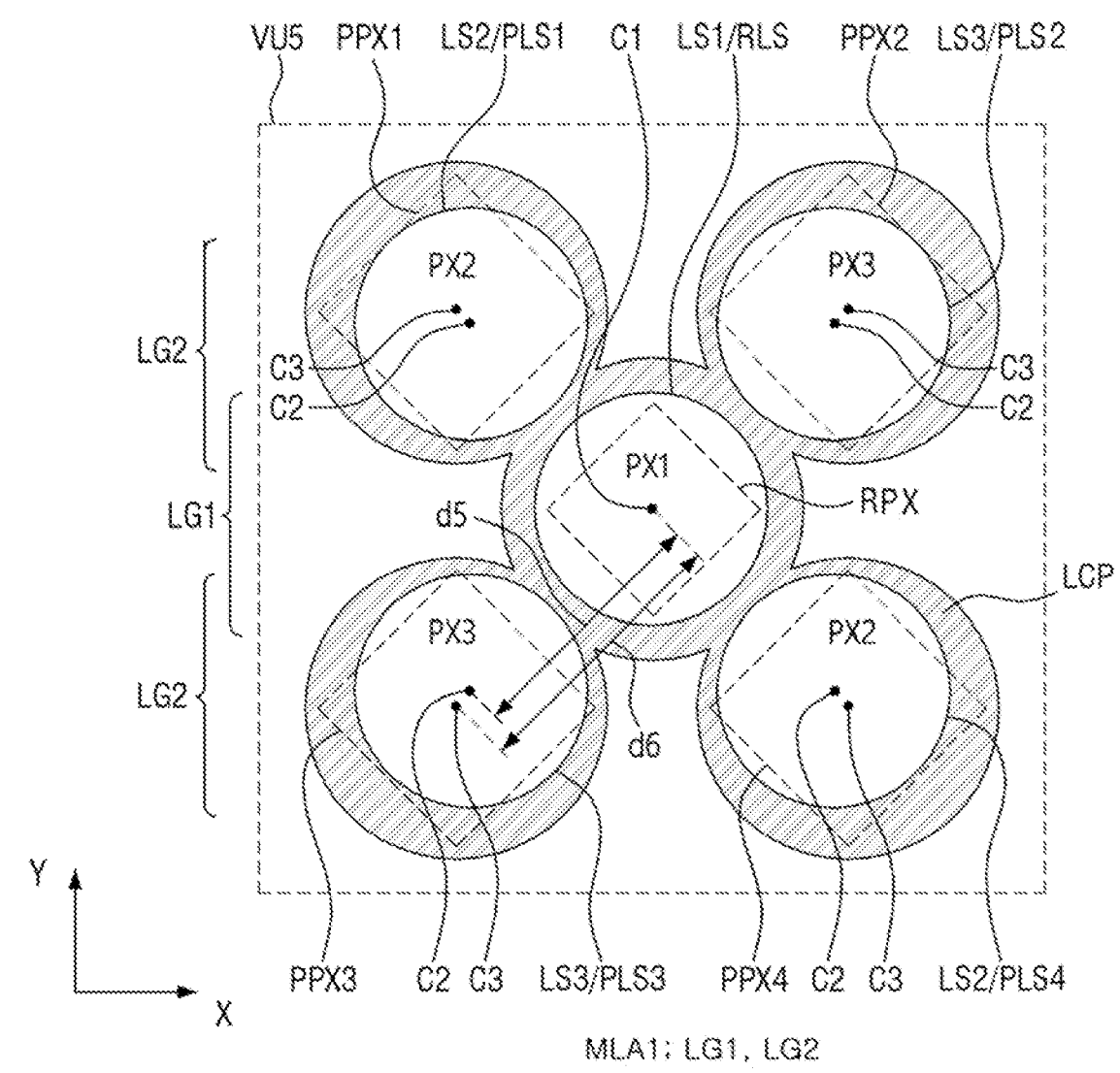
FIG. 14 is a plan view of pixels and microlenses of area II illustrated in FIG. 13.
Figure 15:
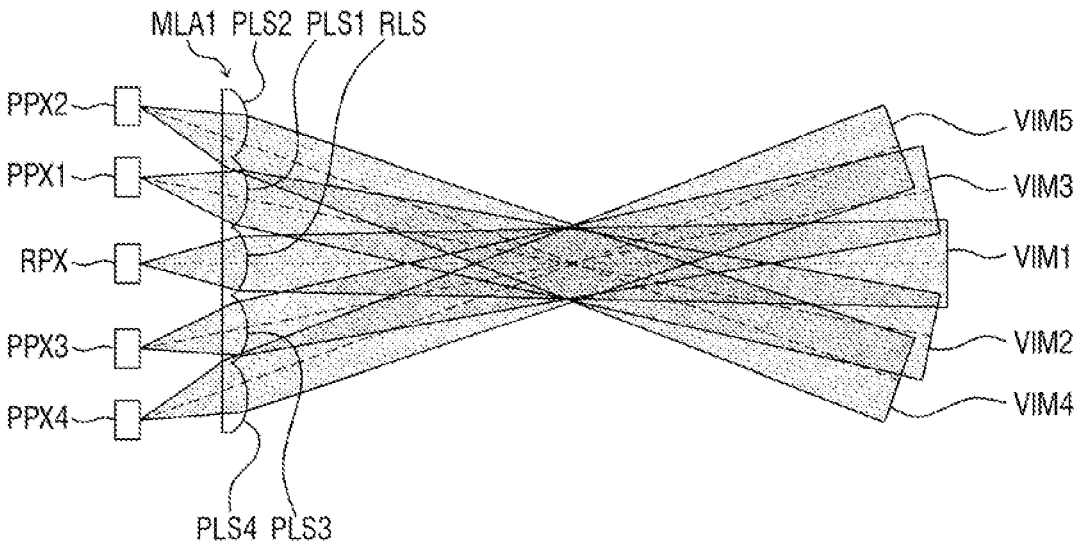
FIG. 15 illustrates an image enlarged by passing through a micro lens array layer MLAL illustrated in FIG. 14.

FIG. 13 is a plan view of a display device according to an embodiment of the present disclosure, FIG. 14 is a plan view of an arrangement relationship between pixels and microlenses of area II illustrated in FIG. 13, and FIG. 15 is illustrates an image enlarged by passing through a micro lens array layer MLAL illustrated in FIG. 14.

Referring to FIG. 13, in an embodiment, the display device includes a plurality of pixel groups. For example, the plurality of pixel groups includes first pixel groups PG1 and second pixel groups PG2. The first pixel groups PG1 and the second pixel groups PG2 are alternately and repeatedly arranged along the first direction (Y direction).

The first pixel groups PG1 include a plurality of first pixels PX1. The plurality of first pixels PX1 are arranged along the second direction (X direction). The second pixel groups PG2 include a plurality of second pixels PX2 and a plurality of third pixels PX3. The second pixels PX2 and the third pixels PX3 are alternately repeated and arranged along the second direction (X direction). A non-pixel area NPA is formed between the first to third pixels PX1, PX2, and PX3.

The arrangement structure of the first to third pixels PX1, PX2, and PX3 illustrated in FIG. 13 is an example, and embodiments of the present disclosure are not necessarily limited thereto. For example, according to an embodiment of the present disclosure, the first pixel PX1, the second pixel PX2, and the third pixel PX3 are arranged in a stripe pattern alternately arranged along the second direction (X direction). In addition, although each of the first to third pixels PX1, PX2, and PX3 is shown as having a rectangular shape, embodiments of the present disclosure are not necessarily limited thereto, and in other embodiments, each of the first to third pixels PX1, PX2, and PX3 may have a polygonal shape, a circular shape, or an oval shape. In an embodiment, the shapes of the first to third pixels PX1, PX2, and PX3 differ from each other. For example, the first pixel PX1 has a circular shape, and the second and third pixels PX2 and PX3 have a rectangular shape.

In addition, FIG. 13 shows that that the sizes of the first pixels PX1 are smaller than the sizes of the second pixels PX2 and the third pixels PX3, but embodiments of the present disclosure are not necessarily limited thereto. For example, in an embodiment of the present disclosure, the first to third pixels PX1, PX2, and PX3 have the same size.

In an embodiment of the present disclosure, the first pixels PX1 are green pixels, the second pixels PX2 are blue pixels, and the third pixels PX3 are red pixels. However, embodiments of the present disclosure are not necessarily limited thereto.

Referring to FIGS. 13 and 14, in an embodiment, the display device includes a micro lens array layer MLA1 that provides a 5-viewpoint image.

The micro lens array layer MLA1 includes a first micro lens group LG1 that corresponds to the first pixel group PG1 and a second micro lens group LG2 that corresponds to the second pixel group PG2. The first micro lens group LG1 includes first micro lenses LS1 that correspond to the first pixels PX1, and the second micro lens group LG2 includes second micro lenses LS2 that correspond to the second pixels PX2 and third micro lenses LS3 that correspond to the third pixels PX3.

The first and second micro lens groups LG1 and LG2 are alternately and repeatedly disposed in the first direction (Y direction), and the second micro lenses LS2 and the third micro lenses LS3 are alternately and repeatedly disposed in the second direction (X direction). Each of the first to third micro lenses LS1 to LS3 has a circular shape in a plan view.

Although FIG. 14 shows that the first to third micro lenses LS1 to LS3 have the same size, embodiments of the present disclosure are not necessarily limited thereto. For example, in an embodiment, the size of the first micro lens LS1 is smaller than the sizes of the second and third micro lenses LS2 and LS3. For example, each of the micro lenses LS1 to LS3 has a different size according to the size of the corresponding pixel.

When the first to third micro lenses LS1 to LS3 have the same size, a size of a total reflection pattern LCP that surrounds the first micro lens LS1, a size of a total reflection pattern LCP that surrounds the second micro lens LS2, and a size of a total reflection pattern LCP that surrounds the third micro lens LS3 are the same. When the first to third micro lenses LS1 to LS3 have different sizes, a size of a total reflection pattern LCP that surrounds the first micro lens LS1, a size of a total reflection pattern LCP that surrounds the second micro lens LS2, and a size of a total reflection pattern LCP that surrounds the third micro lens LS3 differ from each other. For example, each of the total reflection patterns LCP has a different size according to the sizes of the corresponding micro lenses LS1 to LS3.

Referring to FIG. 15, in an embodiment, the micro lens array layer MLA1 enlarges an image output from the corresponding pixel. For example, each of the micro lenses LS1 to LS3 of the micro lens array layer MLA1 corresponds to one of the pixel areas PA. For example, the pixel area PA is enlarged by the micro lenses LS1 to LS3, and the non-pixel area NPA is not enlarged by the micro lens array layer MLA1. Accordingly, the non-pixel area NPA is prevented from being enlarged and visually recognized by a user.

The micro lenses LS1 to LS3 of the micro lens array layer MLA1 are grouped into a plurality of viewpoint units VU5 that provide the 5-viewpoint image. Each viewpoint unit VU5 includes five micro lenses RLS and PLS1 to PLS4. In an embodiment of the present disclosure, each viewpoint unit VU5 includes a reference micro lens RLS that corresponds to a reference pixel RPX and peripheral micro lenses PLS1 to PLS4 that correspond to peripheral pixels PPX1 to PPX4 of the reference pixel RPX. For example, the reference pixel RPX may be the first pixel PX1, and the peripheral pixels PPX1 to PPX4 include two second pixels PX2 and two third pixels PX3 disposed around the first pixel PX1. For convenience of description, the four peripheral pixels are referred to as first to fourth peripheral pixels PPX1 to PPX4, and the four peripheral micro lenses are referred to as first to fourth peripheral micro lenses PLS1 to PLS4.

A midpoint C1 of the reference pixel RPX coincides with a midpoint C1 of the reference micro lens RLS. A midpoint C2 of each of the first to fourth peripheral micro lenses PLS1 to PLS4 is spaced apart from the midpoint C1 of the reference micro lens RLS by a first distance d5. A midpoint C3 of each of the first to fourth peripheral pixels PPX1 to PPX4 is spaced apart from the midpoint C1 of the reference pixel RPX by a second distance d6. For example, the second distance d6 is greater than the first distance d5. For example, the midpoint C3 of each of the first to fourth peripheral pixels PPX1 to PPX4 does not match the midpoint C2 of each of the first to fourth peripheral micro lenses PLS1 to PLS4. Accordingly, images output from the first to fourth peripheral pixels PPX1 to PPX4 are refracted by a corresponding peripheral lens and are focused on one point with an image output from the reference pixel RPX. Accordingly, five viewpoint images VIM1 to VIM5 are expressed by the viewpoint unit VU5.

Figure 16:
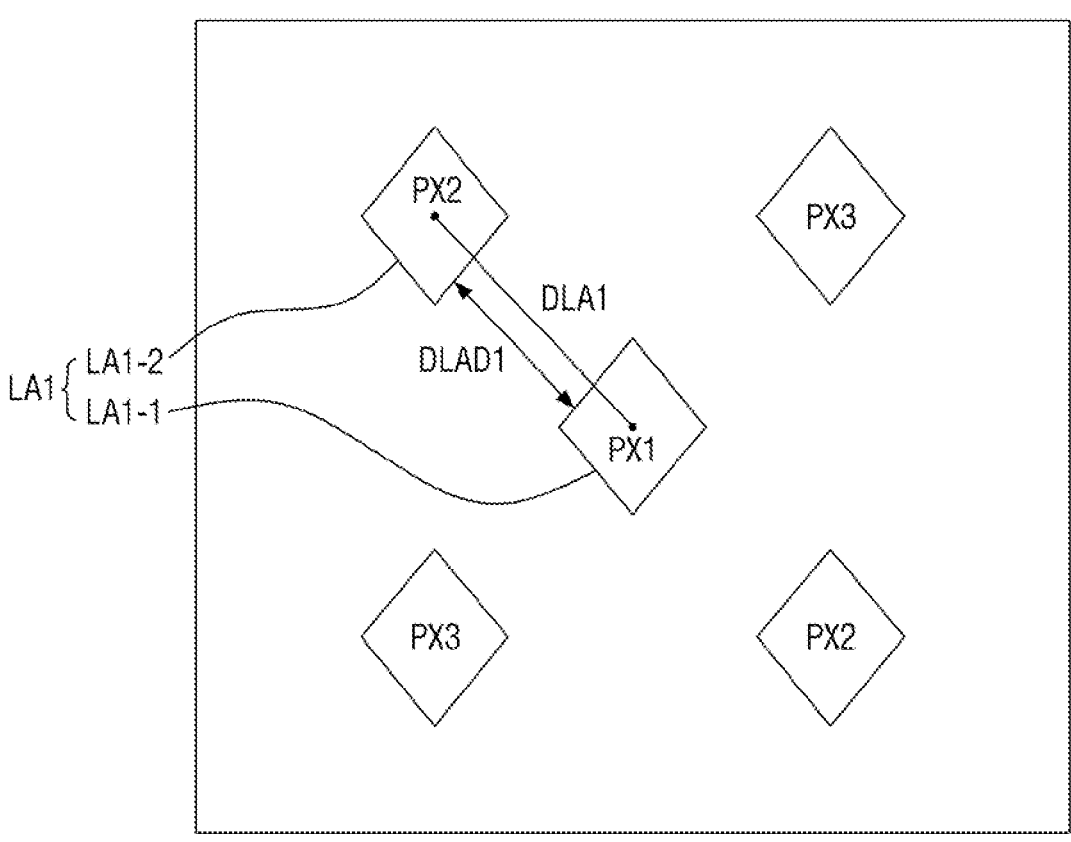
FIGS. 16 and 17 illustrate an increase in external emission efficiency in a display device according to an embodiment of the present disclosure.
Figure 17:
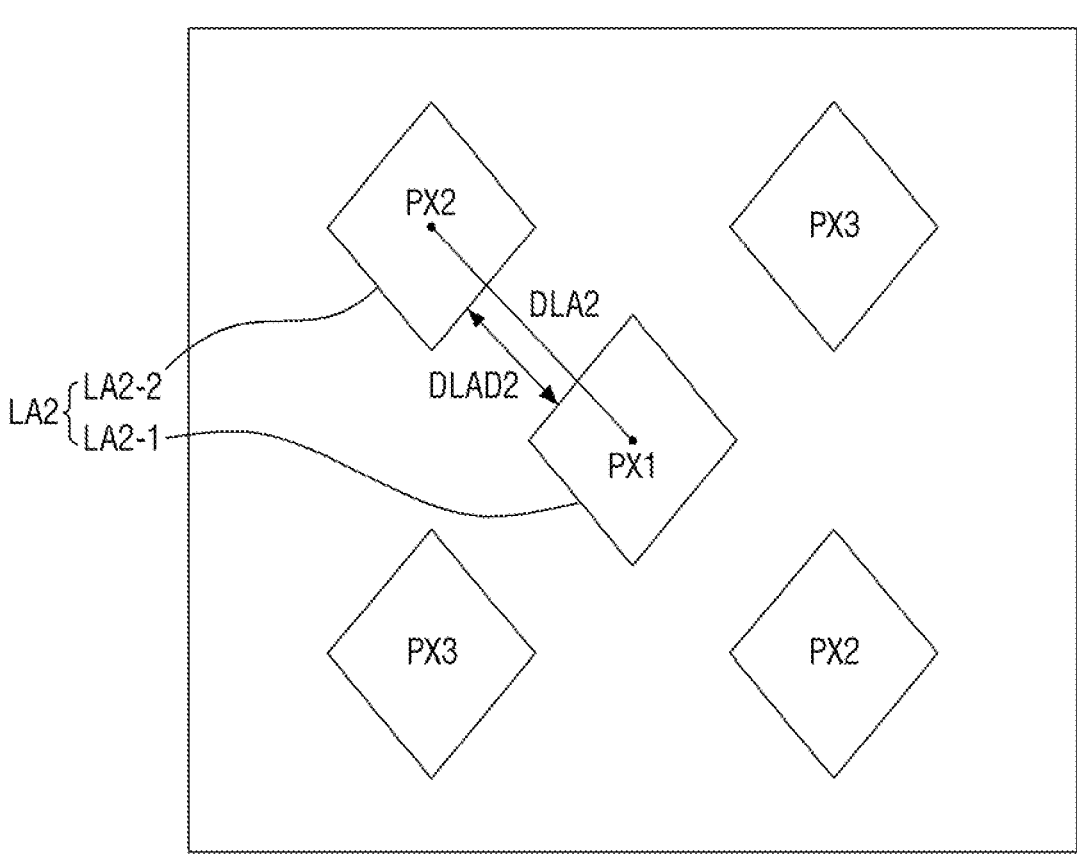

FIGS. 16 and 17 illustrate an increase in external emission efficiency in a display device according to an embodiment of the present disclosure.

FIG. 16 illustrates an example of a light emitting pattern of a pixel PX2 of a display device that lacks the total reflection patterns 190 and 290 and the second pixel electrodes 171-2 and 1171-2, and FIG. 17 illustrates an example of a light emitting pattern for a pixel PX2 of a display device that includes the total reflection patterns 190 and 290 and the second pixel electrodes 171-2 and 1171-2.

Although the light emitting patterns are illustrated has having a rhombus shape, the light emitting patterns correspond to the shape and size of the pixel unit, and are not necessarily limited to those illustrated in FIGS. 16 and 17.

When the light emitting patterns of the same pixel PX2 in FIGS. 16 and 17 are compared, a size of a light emitting pattern LA2-1 in FIG. 17 is greater than a size of a light emitting pattern LA1-1 in FIG. 16. A distance DLA1 between the respective centers of the light emitting pattern LA1-1 that corresponds to the first pixel PX1 and a light emitting pattern LA1-2 that corresponds to the second pixel PX2 adjacent to the first pixel PX1 is the same as a distance DLA2 between the respective centers of the light emitting pattern LA2-1 that corresponds to the first pixel PX1 and a light emitting pattern LA2-2 that corresponds to the second pixel PX2 adjacent to the first pixel PX1. On the other hand, the shortest distance DLAD2 between the light emitting pattern LA2-1 that corresponds to the first pixel PX1 and the light emitting pattern LA2-2 that corresponds to the second pixel PX2 adjacent to the first pixel PX1 is shorter than the shortest distance DLAD1 between the light emitting pattern LA1-1 that corresponds to the first pixel PX1 and the light emitting pattern LA1-2 that corresponds to the second pixel PX2 adjacent to the first pixel PX1.

This means that the external emission efficiency is increased. For example, a display device according to an embodiment of the present disclosure increases the external emission efficiency by totally reflecting the side light emitted from the plurality of light emitting elements LEL.

Figure 18:
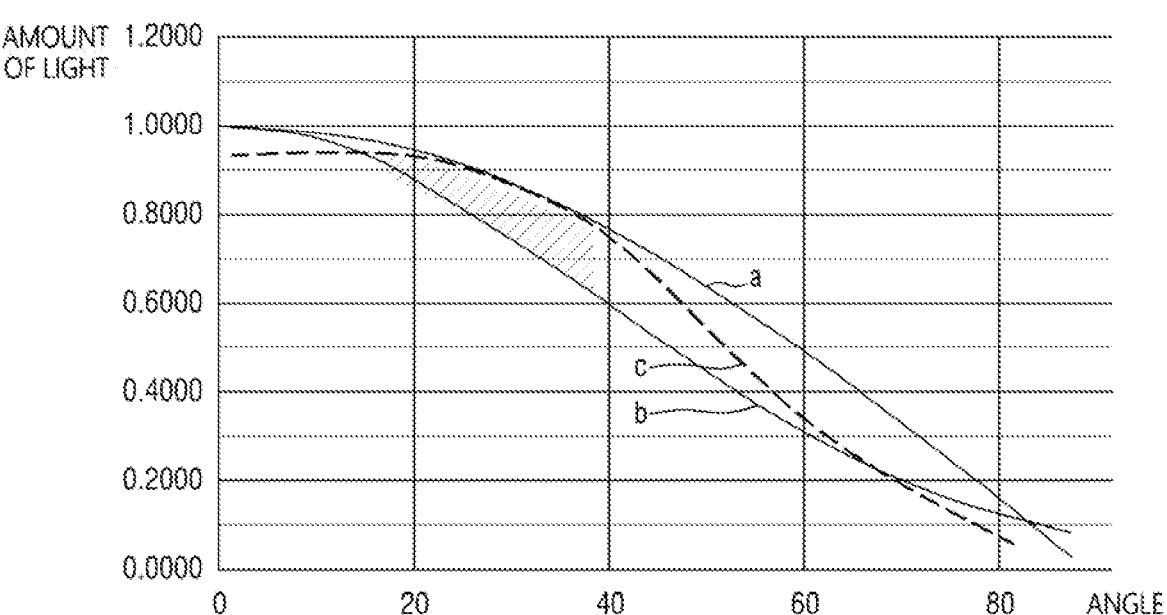
FIG. 18 illustrates a light emission profile as a function of angle in a display device according to an embodiment of the present disclosure.

FIG. 18 illustrates a light emission profile as a function of angle in a display device according to an embodiment of the present disclosure.

In the graph of FIG. 18, the horizontal axis represents an angle of incident light of the display device, and the vertical axis represents an amount of light as a function of the angle of the incident light.

In FIG. 18, "a" represents an ideal light emission profile, "b" represents a light emission profile of a display device that lacks the total reflection patterns 190 and 290 and the second pixel electrodes 171-2 and 1171-2, and "c" represents a light emission profile of the display device that includes the total reflection patterns 190 and 290 and the second pixel electrodes 171-2 and 1171-2.

Referring to a, b, and c in FIG. 18, a display device according to an embodiment that includes the total reflection patterns 190 and 290 and the second pixel electrodes 171-2 and 1171-2 exhibits a result similar to the ideal light emission profile when the incident angle is 20 degrees to 40 degrees. In addition, a display device according to an embodiment that includes the total reflection patterns 190 and 290 and the second pixel electrodes 171-2 and 1171-2 exhibits a result similar to the ideal light emission profile when the incident angle is 15 degrees to 70 degrees as compared to the display device that lacks the total reflection patterns 190 and 290 and the second pixel electrodes 171-2 and 1171-2.

Figure 19:
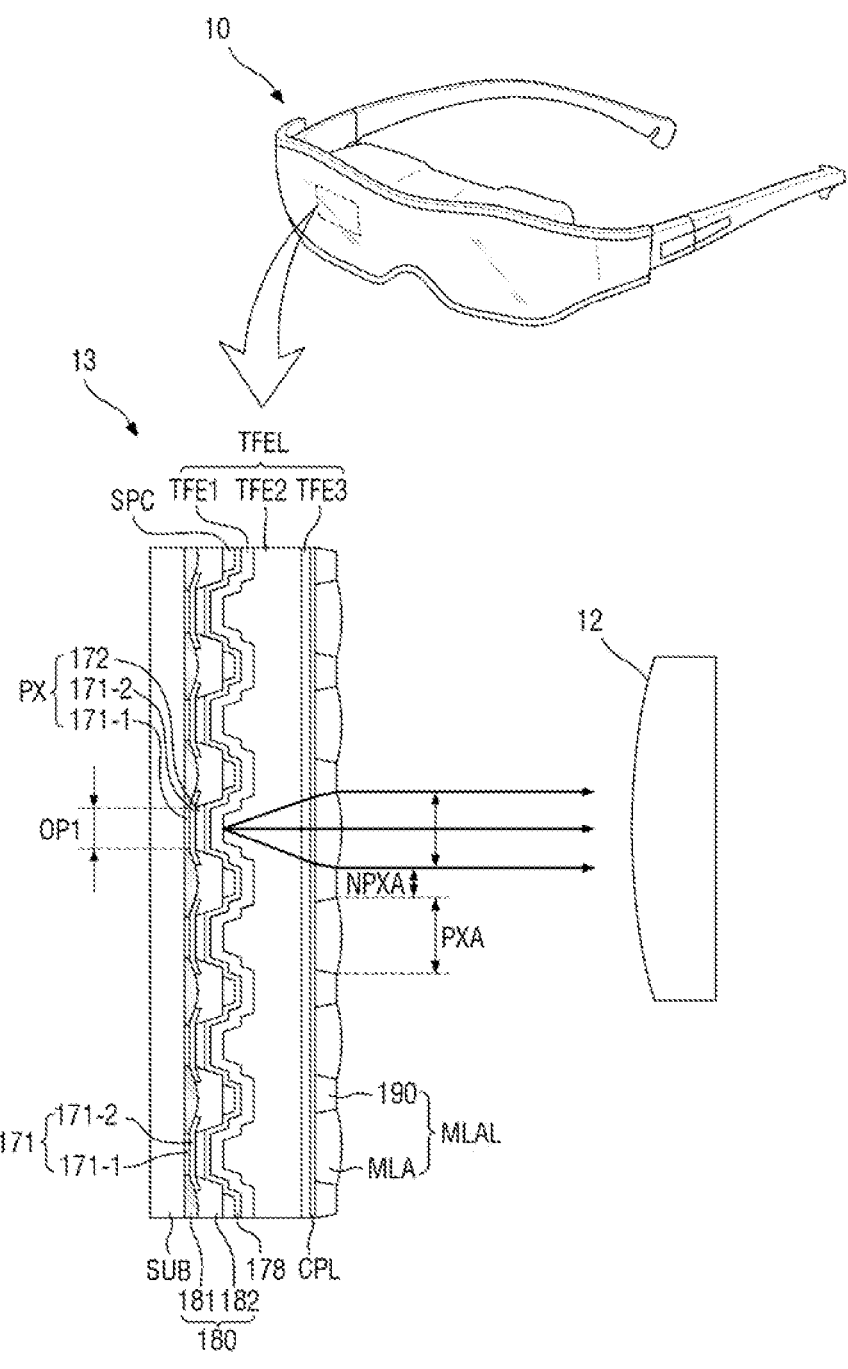
FIG. 19 presents both a perspective view and a cross-sectional view of a head mounted display device that includes a display device illustrated in FIG. 3.

FIG. 19 presents both a perspective view and a cross-sectional view of a head mounted display device that includes a display device illustrated in FIG. 3. Descriptions of components described with reference to FIGS. 3 to 18 may be summarized or omitted.

Referring to FIGS. 3 and 19, a head mounted display device 10 according to an embodiment of the present disclosure include a first display unit 13 and a lens unit 12. In addition, a head mounted display device according to an embodiment of the present disclosure furthers include a camera, an infrared sensor, a signal processing unit, and a frame that can be mounted on a user's head.

The lens unit 12 receives light from the first display unit 13. According to an embodiment, the lens unit 12 is disposed between an object and a user. According to an embodiment, the lens unit 12 is an opaque lens that implements virtual reality. According to an embodiment, the lens unit 12 is one of a transparent lens or a translucent lens that implements augmented reality. According to an embodiment, the lens unit 12 is a convex lens.

Like a display device illustrated in FIG. 3, the first display unit 13 includes a total reflection pattern 190 and a second pixel electrode 171-2. The total reflection pattern 190 and the second pixel electrode 171-2 totally reflect light emitted from the light emitting layer 172 that has an incident angle that is greater than 69° to the capping layer CPL, so that the first display unit 13 enlarges a light emitting area. Thus, the external emission efficiency is increased.

In addition, the user can view an enlarged image since an image of the first display unit 13 is enlarged by the lens unit 12. However, due to the enlarged environment, a screen door effect (SDE) can occur. For example, the gap between the pixel defining layers in the display unit can be visually recognized by the user due to the enlarged environment. However, the area visually recognized by the user due to the enlarged environment corresponds to the non-light emitting area.

As described above, a head mounted display device according to an embodiment of the present disclosure can increase the external emission efficiency and increase the light emitting area, which corresponds to a reduction in the non-light emitting area.

For example, a head mounted display device according to an embodiment of the present disclosure reduces the size of the non-light emitting area, and reduce the size of the non-light emitting area that can be visually recognized by the user due to the enlarged environment. Accordingly, the screen door effect is reduced.

Figure 20:
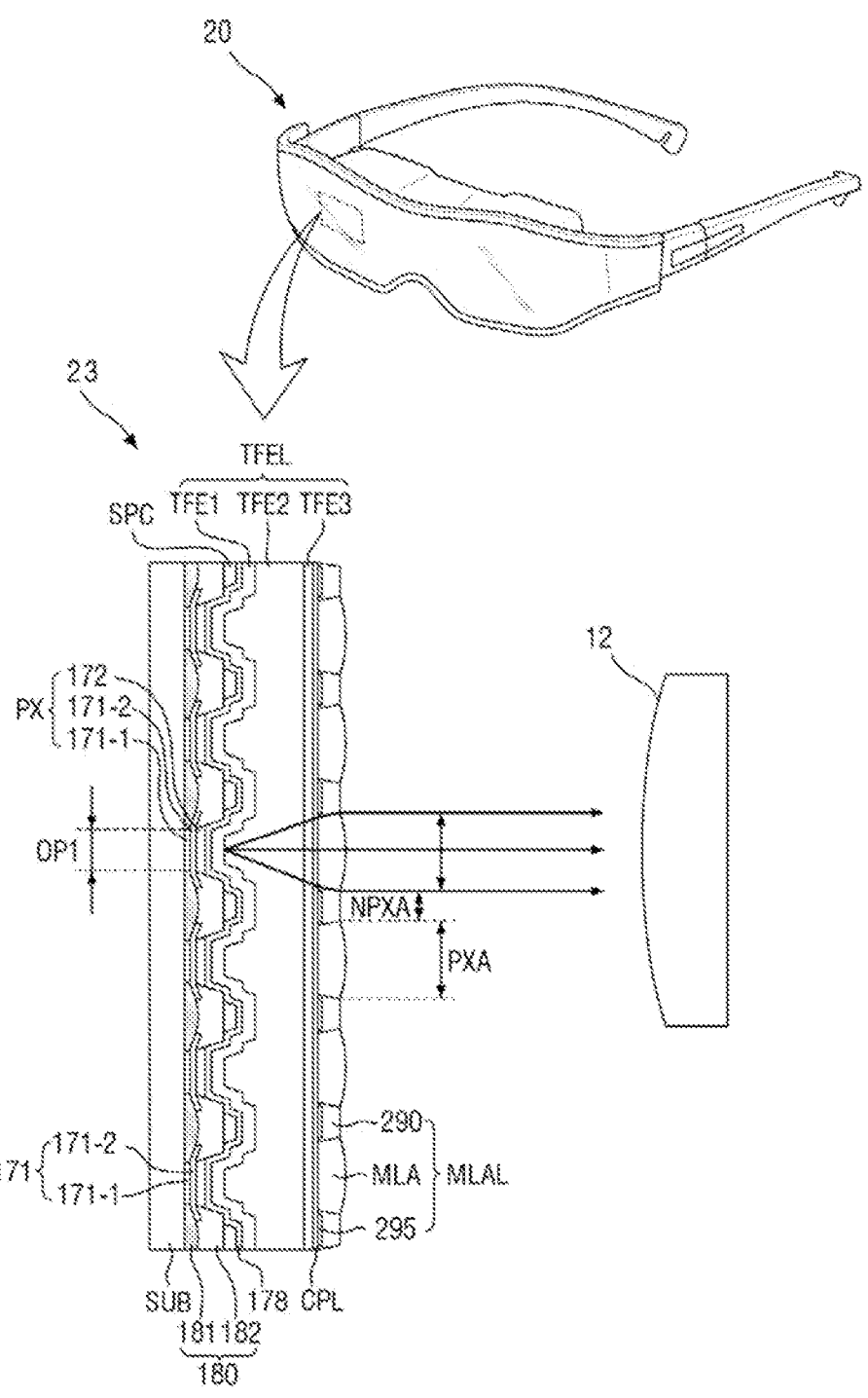
FIG. 20 presents both a perspective view and a cross-sectional view of a head mounted display device that includes a display device illustrated in FIG. 8.

FIG. 20 presents both a perspective view and a cross-sectional view of a head mounted display device that includes a display device illustrated in FIG. 8. Descriptions of components described with reference to FIGS. 8 to 18 and 19 may be summarized or omitted.

Referring to FIGS. 8 and 20, a head mounted display device 20 according to an embodiment of the present disclosure include a second display unit 23 and the lens unit 12. In addition, a head mounted display device according to an embodiment of the present disclosure further includes a camera, an infrared sensor, a signal processing unit, and a frame that can be mounted on a user's head.

The lens unit 12 receives light from the second display unit 23.

Like the display device illustrated in FIG. 8, the second display unit 23 includes a second pixel electrode 171-2, a total reflection pattern 290, and a light blocking pattern 295. The total reflection pattern 190 and the second pixel electrode 171-2 totally reflect light emitted from the light emitting layer 172 that has an incident angle of 69° or more to the capping layer CPL, so that the second display unit 23 enlarges a light emitting area. Thus, an effective emission area ratio is increased.

Accordingly, a head mounted display device according to an embodiment of the present disclosure reduces the screen door effect by increasing the effective emission area ratio.

However, features of the disclosure are not restricted to those set forth herein. The above and other features of the disclosure will become more apparent to one of daily skill in the art to which the disclosure pertains by referencing the claims, with functional equivalents thereof to be included therein.

What is claimed is:

1. A display device, comprising:
a substrate;
a sub-pixel disposed on the substrate and that includes a pixel electrode, a light emitting layer, and a common electrode;
a pixel defining layer that defines the sub-pixel;
a capping layer disposed on the pixel defining layer;
a micro lens disposed directly on the capping layer and that overlaps the sub-pixel; and
a total reflection pattern disposed on the capping layer and that overlaps the pixel defining layer and surrounds the micro lens,
wherein the micro lens has a refractive index greater than a refractive index of the total reflection pattern and less than or equal to a refractive index of the capping layer
wherein the pixel electrode includes a first pixel electrode and a second pixel electrode disposed on the first pixel electrode,
wherein a side surface of the second pixel electrode has a first inclination angle with respect to a top surface of the first pixel electrode,
wherein the pixel defining layer includes
a first pixel defining layer that includes a first opening that exposes at least a portion of the first pixel electrode and
a second pixel defining layer that includes a second opening that exposes at least a portion of the second pixel electrode, and
the second pixel defining layer is disposed on the first pixel defining layer.

2. The display device of claim 1, wherein a difference between the refractive index of the micro lens and the refractive index of the total reflection pattern is greater than 0.05 and less than 0.3.

3. The display device of claim 1, wherein the second opening is smaller than the first opening.

4. The display device of claim 3, wherein the micro lens has a larger diameter than the second opening.

5. The display device of claim 1, wherein the side surface of the second pixel electrode is disposed on the first pixel defining layer.

6. The display device of claim 1, wherein the side surface of the second pixel electrode overlaps the total reflection pattern.

7. The display device of claim 1, wherein the side surface of the second pixel electrode does not overlap the total reflection pattern.

8. The display device of claim 1, wherein
the total reflection pattern has a second inclination angle on a side surface in contact with the micro lens, and
the second inclination angle is greater than the first inclination angle.

9. The display device of claim 1, wherein the first pixel defining layer includes an opaque material that blocks light.

10. The display device of claim 1, wherein the first pixel defining layer is formed of a same material as the second pixel defining layer.

11. The display device of claim 10, wherein the second pixel defining layer is formed of a transparent organic material.

12. The display device of claim 1, further comprising a light blocking pattern disposed between the capping layer and the total reflection pattern and covered by the total reflection pattern.

13. A display device, comprising:
a substrate;
a sub-pixel disposed on the substrate and that includes a pixel electrode, a light emitting layer, and a common electrode;

a pixel defining layer that defines the sub-pixel;

a capping layer disposed on the pixel defining layer;

a micro lens disposed on the capping layer and that overlaps the sub-pixel; and a total reflection pattern disposed on the capping layer and that overlaps the pixel defining layer and surrounds the micro lens, wherein the pixel electrode includes a first pixel electrode and a second pixel electrode disposed on the first pixel electrode, wherein a side surface of the second pixel electrode has a first inclination angle with respect to a top surface of the first pixel electrode, the total reflection pattern has a second inclination angle on a side surface in contact with the micro lens, and the second inclination angle is greater than the first inclination angle.

14. The display device of claim 13, wherein a difference between a refractive index of the micro lens and a refractive index of the total reflection pattern is greater than 0.05 and less than 0.3.

15. The display device of claim 13, wherein the pixel defining layer includes a first pixel defining layer that includes a first opening that exposes at least a portion of the first pixel electrode and a second pixel defining layer that includes a second opening that exposes at least a portion of the second pixel electrode, and the second pixel defining layer is disposed on the first pixel defining layer.

16. The display device of claim 15, wherein the second opening is smaller than the first opening.

17. The display device of claim 13, further comprising a light blocking pattern disposed between the capping layer and the total reflection pattern and covered by the total reflection pattern.

18. A head mounted display device, comprising:

a display unit; and a lens unit disposed on a path of light emitted from the display unit, wherein the display unit includes:

a substrate;

a sub-pixel disposed on the substrate and that includes a pixel electrode, a light emitting layer, and a common electrode;

a pixel defining layer that defines the sub-pixel;

a capping layer disposed on the pixel defining layer;

a micro lens disposed on the capping layer and that overlaps the sub-pixel; and a total reflection pattern disposed on the capping layer and that overlaps the pixel defining layer and surrounds the micro lens, wherein the micro lens has a refractive index greater than a refractive index of the total reflection pattern and less than or equal to a refractive index of the capping layer, wherein the pixel electrode includes a first pixel electrode and a second pixel electrode disposed on the first pixel electrode, wherein a side surface of the second pixel electrode has a first inclination angle with respect to a top surface of the first pixel electrode, wherein the total reflection pattern has a second inclination angle on a side surface in contact with the micro lens, and the second inclination angle is greater than the first inclination angle.

19. The head mounted display device of claim 18, wherein a difference between the refractive index of the micro lens and the refractive index of the total reflection pattern is greater than 0.05 and less than 0.3.

20. The head mounted display device of claim 18, further comprising a light blocking pattern disposed between the capping layer and the total reflection pattern and covered by the total reflection pattern.

* * * * *